US012653054B2

(12) United States Patent
Cho et al.

(10) Patent No.: US 12,653,054 B2
(45) Date of Patent: Jun. 9, 2026

(54) CHIP-ON-FILM SEMICONDUCTOR PACKAGE AND DISPLAY APPARATUS INCLUDING THE SAME

(71) Applicant: SAMSUNG ELECTRONICS CO., LTD., Suwon-si (KR)

(72) Inventors: Seunghyun Cho, Suwon-si (KR); Jaemin Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 635 days.

(21) Appl. No.: 18/092,241

(22) Filed: Dec. 31, 2022

(65) Prior Publication Data

US 2023/0326930 A1      Oct. 12, 2023

(30) Foreign Application Priority Data

Apr. 11, 2022    (KR) ........................ 10-2022-0044756

(51) Int. Cl.
H10W 70/67        (2026.01)
G02F 1/1345        (2006.01)

(52) U.S. Cl.
CPC ...... H10W 70/688 (2026.01); G02F 1/13452 (2013.01)

(58) Field of Classification Search
CPC ........... G02F 1/13452; H01L 23/4985; H10W 70/688
See application file for complete search history.

(56) References Cited

U.S. PATENT DOCUMENTS

| | | |
|---|---|---|
| 7,683,476 B2 | 3/2010 | Lee et al. |
| 7,851,922 B2 | 12/2010 | Corisis |
| 9,883,593 B2 | 1/2018 | Cho et al. |
| 10,561,022 B2 | 2/2020 | Kwon et al. |
| 10,840,191 B2 | 11/2020 | Jung et al. |
| 11,133,262 B2 | 9/2021 | Min et al. |
| 2008/0055291 A1 | 3/2008 | Hwang et al. |

(Continued)

FOREIGN PATENT DOCUMENTS

| | | |
|---|---|---|
| KR | 10-2007-0029470 A | 3/2007 |
| KR | 10-2008-0020858 A | 3/2008 |
| KR | 10-1908498 | 10/2018 |

(Continued)

OTHER PUBLICATIONS

Office Action dated Aug. 13, 2025 issued in corresponding Korean Patent Application No. 10-2022-0044756.

*Primary Examiner* — Peter M Albrecht
(74) *Attorney, Agent, or Firm* — Morgan, Lewis & Bockius LLP

(57)        ABSTRACT

A chip-on-film (COF) semiconductor package includes: a main film substrate having at least two module attachment regions spaced apart from each other; at least two sub-modules respectively attached to the at least two module attachment regions and spaced apart from each other on the main film substrate, wherein each of the at least two sub-modules comprise a sub-film substrate and a semiconductor chip mounted on the sub-film substrate; and at least two connection conductive layers provided between the main film substrate and the sub-film substrate, which is included in each of the at least two sub-modules, and electrically connecting the main film substrate to the at least two sub-modules.

19 Claims, 18 Drawing Sheets

(56)        References Cited

U.S. PATENT DOCUMENTS

2020/0211972 A1 *    7/2020   Min  ..................... H01L 23/5386
2022/0373670 A1 *    11/2022  Yu  ........................... G01S 13/58

FOREIGN PATENT DOCUMENTS

KR       10-2019-0095684  A       8/2019
KR              10-2013384        8/2019
KR       10-2022-0002258  A       1/2022
WO           2020/217411  A1     10/2020

* cited by examiner

CHIP-ON-FILM SEMICONDUCTOR PACKAGE AND DISPLAY APPARATUS INCLUDING THE SAME

CROSS-REFERENCE TO RELATED APPLICATION

This application claims priority under 35 U.S.C. § 119 to Korean Patent Application No. 10-2022-0044756, filed on Apr. 11, 2022, in the Korean Intellectual Property Office, the disclosure of which is incorporated by reference herein in its entirety.

TECHNICAL FIELD

The present inventive concept relates to a semiconductor package and a display apparatus including the same, and more particularly, to a chip-on-film (COF) semiconductor package and a display apparatus including the same.

DISCUSSION OF THE RELATED ART

A film-type semiconductor package (e.g., a COF semiconductor package) generally includes a semiconductor chip mounted on a film substrate and pads of the semiconductor chip bonded to a metal pattern (or, e.g., lead) on the film substrate through bumps. The COF semiconductor package may be connected to an external circuit through input/output pins connected to the metal pattern on the film substrate.

As miniaturization of electronic products, like display apparatus, increases, it is desirable to implement a metal pattern (or, e.g., lead) on a film substrate, which is included in a COF semiconductor package, with a fine pitch.

SUMMARY

The present inventive concept provides a chip-on-film (COF) semiconductor package capable of implementing a fine pitch and a display apparatus including the same.

According to an embodiment of the present inventive concept, a chip-on-film (COF) semiconductor package includes: a main film substrate having at least two module attachment regions spaced apart from each other; at least two sub-modules respectively attached to the at least two module attachment regions and spaced apart from each other on the main film substrate, wherein each of the at least two sub-modules comprise a sub-film substrate and a semiconductor chip mounted on the sub-film substrate; and at least two connection conductive layers provided between the main film substrate and the sub-film substrate, which is included in each of the at least two sub-modules, and electrically connecting the main film substrate to the at least two sub-modules.

According to an embodiment of the present inventive concept, a chip-on-film (COF) semiconductor package includes: a main film substrate having at least two module attachment regions spaced apart from each other, wherein the main film substrate includes: a main base film; a plurality of main conductive wires including a plurality of main input wires and a plurality of main output wires; and a plurality of main input pins and a plurality of main output pins, which are connected to the main conductive wires and are arranged at a first edge and a second edge of the main film substrate, respectively. The COF semiconductor package further includes at least two sub-film substrates, each including: a sub base film having a first sub-surface and a second sub-surface opposite to each other; a plurality of sub conductive wires, which are arranged on at least one of the first sub-surface or the second sub-surface and comprise a plurality of sub input wires and a plurality of sub output wires; and a plurality of sub input pins and a plurality of sub output pins, which are connected to the sub conductive wires and are arranged at a first edge and a second edge of the sub-film substrate, respectively, wherein the at least two sub-film substrates are attached to the at least two module attachment regions, respectively; at least two semiconductor chips respectively attached to first sub-surfaces of the at least two sub base films; and connection conductive layers arranged between the sub input pins of the at least two sub-film substrates and the main input pins of the main film substrate and between the sub output pins of the at least two sub-film substrates and the main output pins of the main film substrate.

According to an embodiment of the present inventive concept, a display apparatus includes: a display panel including: a transparent substrate; an image region formed on the transparent substrate; and a plurality of panel connection wires. The display apparatus further includes a chip-on-film (COF) semiconductor package including: a main film substrate having a first module attachment region and a second module attachment region spaced apart from each other; a first sub-module and a second sub-module, which are respectively attached to the first module attachment region and the second module attachment region of the main film substrate, and each of the first sub-module and the second sub-module includes a sub-film substrate and a semiconductor chip mounted on the sub-film substrate; and connection conductive layers arranged between sub-film substrates of the first sub-module and the second sub-module and the main film substrate, and electrically connecting each of the first sub-module and the second sub-module to the main film substrate, wherein the main film substrate includes: a main base film; a plurality of main conductive wires arranged on at least one surface of the main base film and including a plurality of main input wires and a plurality of main output wires; and a plurality of main input pins and a plurality of main output pins connected to the main conductive wires and respectively arranged at a first edge and a second edge of the main film substrate, wherein the sub-film substrate includes: a sub base film having a first sub-surface and a second sub-surface opposite to each other; a plurality of sub conductive wires arranged on at least one of the first sub-surface or the second sub-surface and including a plurality of sub input wires and a plurality of sub output wires; and a plurality of sub input pins and a plurality of sub output pins connected to the sub conductive wires and respectively arranged at a first edge and a second edge of the sub-film substrate, wherein the semiconductor chip includes a plurality of chip terminals arranged on one surface of the semiconductor chip, wherein some of the chip terminals of the semiconductor chip are connected to the sub input wires, and other chip terminals of the semiconductor chip are connected to the sub output wires, wherein one of the conductive layers is provided between the sub input pins and the main input wires, and the other one of the conductive layers is provided between the sub output pins and the main output wires, and wherein the main output pins are connected to the panel connection wires.

BRIEF DESCRIPTION OF THE DRAWINGS

The above and other aspects of the present inventive concept will become more apparent by describing in detail embodiments thereof, with reference to the accompanying drawings, in which:

FIG. 8 is a schematic cross-sectional view of a COF semiconductor package according to an embodiment of the present inventive concept;

FIG. 11 is a schematic plan view of a COF semiconductor package according to an embodiment of the present inventive concept;

FIG. 12 is a schematic plan view of a COF semiconductor package according to an embodiment of the present inventive concept;

FIG. 13 is a schematic plan view of a COF semiconductor package according to an embodiment of the present inventive concept.

DETAILED DESCRIPTION OF THE EMBODIMENTS

Figure 1A:
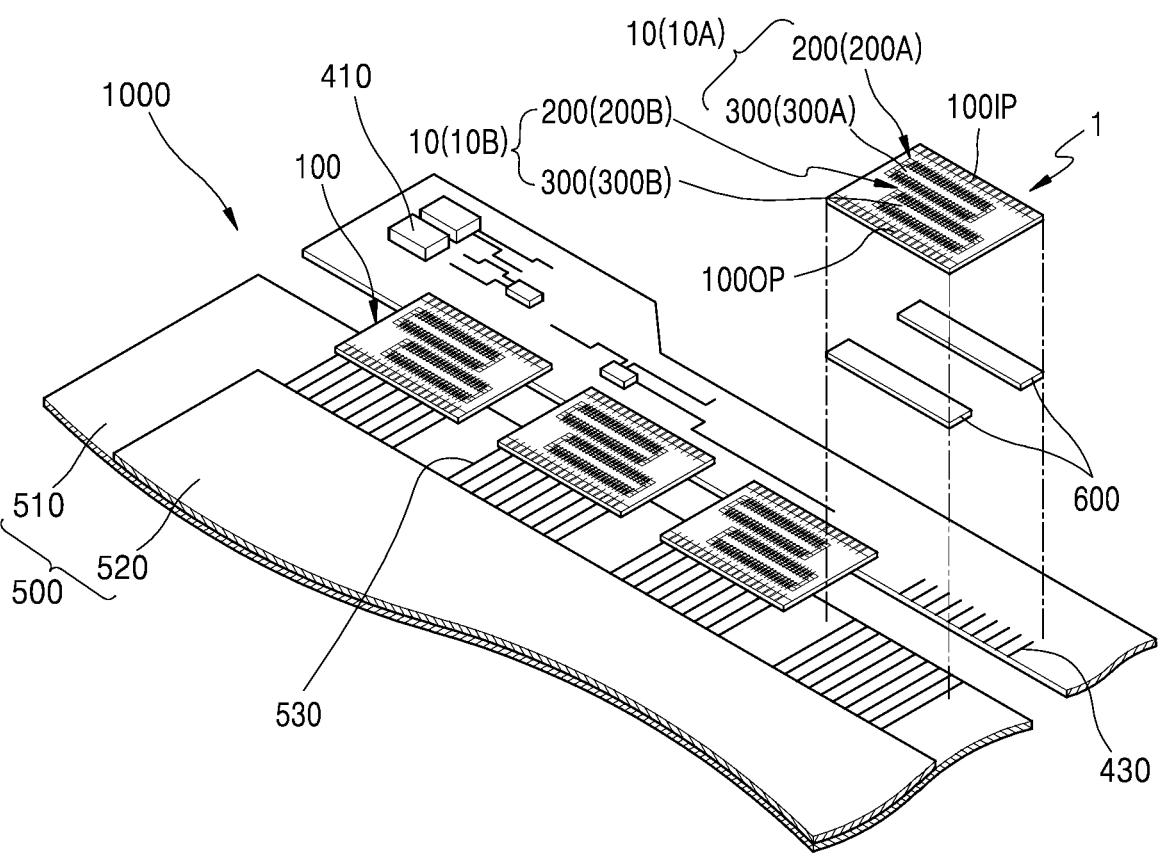
FIGS. 1A and 1B are a perspective view and a block diagram schematically showing a display apparatus including a chip-on-film (COF) semiconductor package according to an embodiment of the present inventive concept.

Embodiments of the present inventive concept will be described more fully hereinafter with reference to the accompanying drawings. In the figures, like reference numerals may denote like elements or features, and thus their descriptions may be omitted.

Figure 1B:
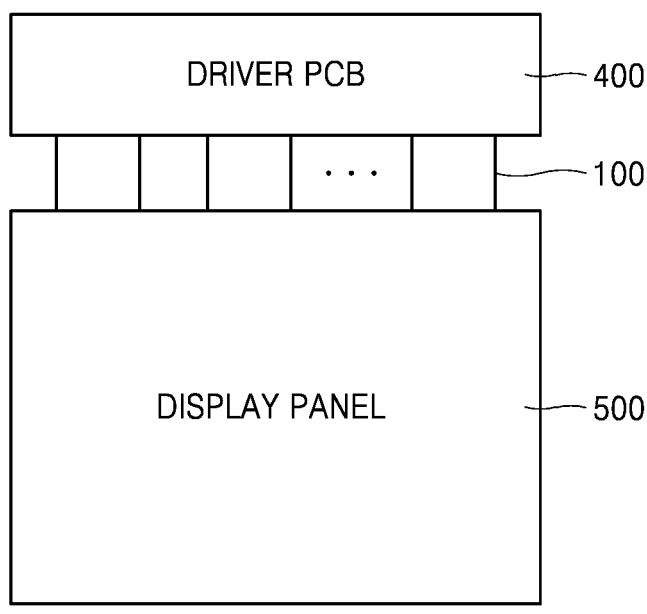

FIGS. 1A and 1B are a perspective view and a block diagram schematically showing a display apparatus including a chip-on-film (COF) semiconductor package according to an embodiment of the present inventive concept.

Referring to FIGS. 1A and 1B together, a display apparatus 1000 may include at least one COF semiconductor package 1, a driver printed circuit board (PCB) 400, and a display panel 500. At least one COF semiconductor package 1 may be connected between the driver PCB 400 and the display panel 500. The COF semiconductor package 1 may receive a signal output from the driver PCB 400 and transmit the signal to the display panel 500.

The COF semiconductor package 1 may be, for example, a display driver IC (DDI) package including a semiconductor chip 300, which is a DDI. The COF semiconductor package 1 may include at least two semiconductor chips 300 including a first semiconductor chip 300A and a second semiconductor chip 300B. For example, the first semiconductor chip 300a and the second semiconductor chip 300b may each be a DDI.

The COF semiconductor package 1 may include a main film substrate 100, a sub-film substrate 200, and the semiconductor chips 300. The semiconductor chips 300 may be mounted on the sub-film substrate 200, and the sub-film substrate 200, which has the semiconductor chips 300 mounted thereon, may be mounted on the main film substrate 100. The COF semiconductor package 1 may include the at least two semiconductor chips 300 including the first semiconductor chip 300A and the second semiconductor chip 300B. The COF semiconductor package 1 may include at least two sub-film substrates 200 including a first sub-film substrate 200A and a second sub-film substrate 200B. The first semiconductor chip 300A may be mounted on the first sub-film substrate 200A, and the second semiconductor chip 300B may be mounted on the second sub-film substrate 200B. The first sub-film substrate 200A, which has the first semiconductor chip 300A mounted thereon, and the second sub-film substrate 200B, which has the second semiconductor chip 300B mounted thereon, may be mounted on the main film substrate 100.

The sub-film substrate 200 having the semiconductor chip 300 mounted thereon may be referred to as a sub-module 10. For example, the first sub-film substrate 200A having the first semiconductor chip 300A mounted thereon may be referred to as a first sub-module 10A, and the second sub-film substrate 200B having the second semiconductor chip 300B mounted thereon may be referred to as a second sub-module 10B. The COF semiconductor package 1 may include at least two sub-modules 10 including the first sub-module 10A and the second sub-module 10B.

One or more driving circuit chips 410 capable of simultaneously applying power and a signal to the COF semiconductor package 1 may be mounted on the driver PCB 400.

The display panel 500 may be, for example, a liquid crystal display (LCD) panel, a light-emitting diode (LED) panel, an organic LED (OLED) panel, or a plasma display panel (PDP).

The COF semiconductor package 1 may be connected to each of a driving connection wire 430 of the driver PCB 400 and a panel connection wire 530 of the display panel 500.

In an embodiment of the present inventive concept, one COF semiconductor package 1 may be connected between the driver PCB 400 and the display panel 500. For example, when the display panel 500 is used to provide a small screen like that of a mobile phone or to support low resolution, the display apparatus 1000 may include at least one COF semiconductor package 1.

In an embodiment of the present inventive concept, a plurality of COF semiconductor packages 1 may be connected between the driver PCB 400 and the display panel 500. For example, when the display panel 500 is used to provide a large screen like that of a television or to support high resolution, the display apparatus 1000 may include a plurality of COF semiconductor packages 1.

The COF semiconductor package 1 may be connected to at least one side of the display panel 500. In an embodiment of the present inventive concept, one or a plurality of COF semiconductor packages 1 may be connected to only one of four sides of the display panel 500 and might not be connected to the other three sides. However, the present inventive concept is not limited thereto, and, in an embodiment of the present inventive concept, one or a plurality of COF semiconductor packages 1 may be respectively connected to each of two or more sides of the display panel 500. For example, one or a plurality of COF semiconductor packages 1 may be respectively connected to two sides of the display panel 500 that may be connected to each other.

When the COF semiconductor package 1 is connected to only one of the four sides of the display panel 500, at least one of at least two semiconductor chips 300 included in the COF semiconductor package 1 may be connected to gate lines of the display panel 500 and serve as a gate driver, whereas at least one other of the at least two semiconductor chips 300 may be connected to source lines of the display panel 500 and serve as a source driver. For example, the first semiconductor chip 300A may be connected to the gate lines of the display panel 500 and serve as a gate driver, and the second semiconductor chip 300B may be connected to the source lines of the display panel 500 and serve as a source driver. However, the present inventive concept is not limited thereto. For example, the second semiconductor chip 300B may be connected to the gate lines of the display panel 500 and serve as a gate driver, and the first semiconductor chip 300A may be connected to the source lines of the display panel 500 and serve as a source driver.

The display panel 500 may include a transparent substrate 510, an image region 520 formed on the transparent substrate 510, and a plurality of panel connection wires 530. The transparent substrate 510 may be, for example, a glass substrate or a transparent flexible substrate. A plurality of pixels of the image region 520 may be respectively connected to the panel connection wires 530 and may operate according to a signal provided by the semiconductor chip 300 included in the COF semiconductor package 1.

In the COF semiconductor package 1, a plurality of main input pins 100IP may be formed at one edge of the main film substrate 100 and a plurality of main output pins 100OP may be formed at the other edge (e.g., an opposing edge) of the main film substrate 100. The main input pins 100IP and the main output pins 100OP may be respectively connected to the driving connection wires 430 of the driver PCB 400 and the panel connection wires 530 of the display panel 500 by an anisotropic conductive layer 600. The anisotropic conductive layer 600 may include, for example, an anisotropic conductive film or an anisotropic conductive paste. For example, the anisotropic conductive layer 600 has a structure in which conductive particles are dispersed in an insulating adhesive layer and may exhibit anisotropic electrical characteristics that, when connected, electricity is conducted in an electrode direction, that is, a vertical direction (Z direction), and electricity is insulated in directions between electrodes, that is, horizontal directions. When an adhesive is melted by applying heat and pressure to the anisotropic conductive layer 600, conductive particles are arranged between opposing electrodes (e.g., between the main input pins 100IP and the driving connection wires 430 or between the main output pins 100OP and the panel connection wires 530) and exhibit conductivity. In addition, the adhesive is filled between horizontally adjacent electrodes, and electricity is insulated therebetween.

Figure 2A:
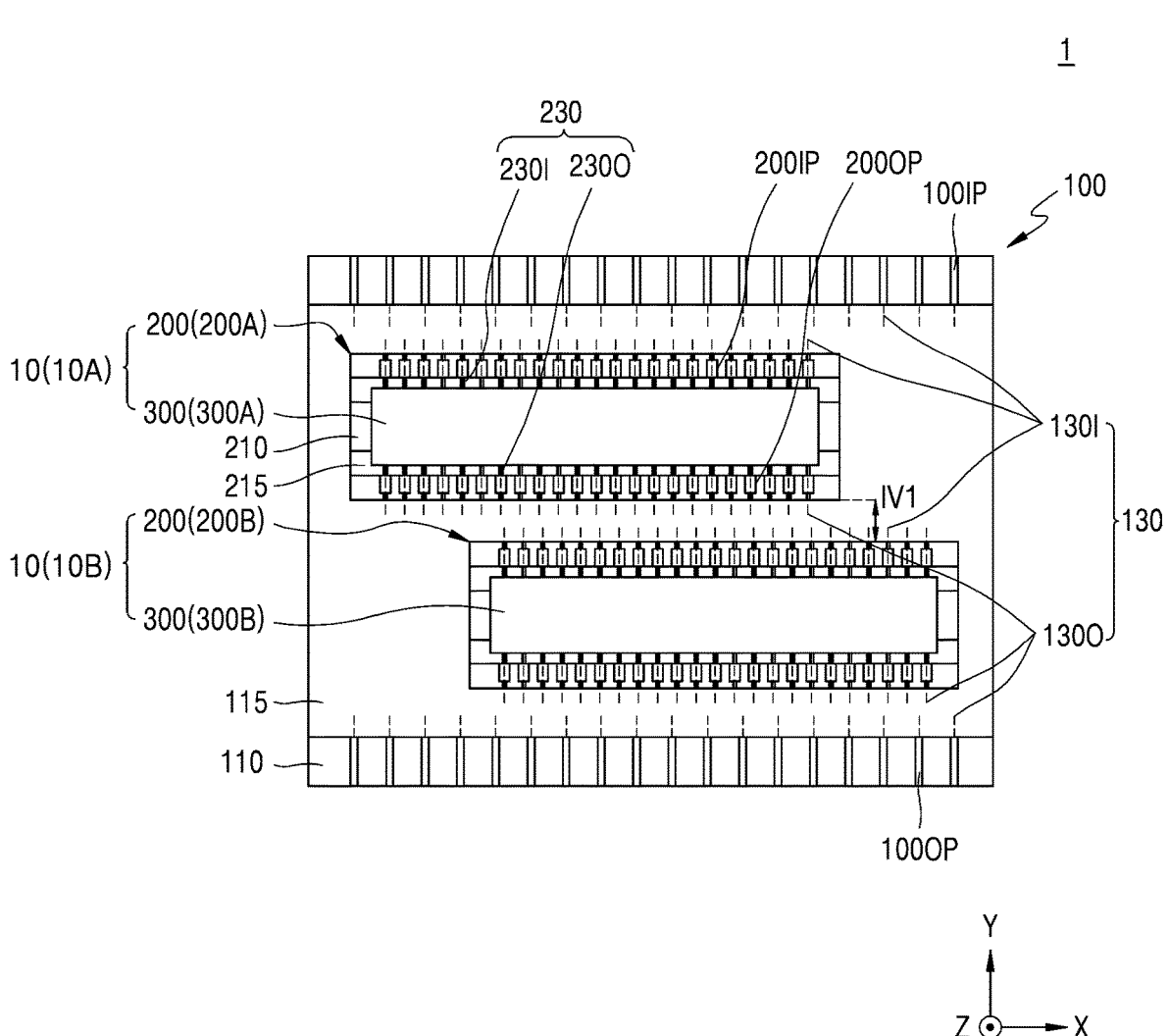
FIGS. 2A and 2B are a plan view and an exploded perspective view schematically showing a COF semiconductor package according to an embodiment of the present inventive concept.
Figure 2B:
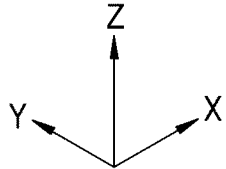

FIGS. 2A and 2B are a plan view and an exploded perspective view schematically showing a COF semiconductor package according to an embodiment of the present inventive concept.

Referring to FIGS. 2A and 2B together, the COF semiconductor package 1 may include the main film substrate 100, the sub-film substrate 200, and the semiconductor chip 300. The semiconductor chips 300 may be mounted on the sub-film substrate 200, and the sub-film substrate 200, having the semiconductor chips 300 mounted thereon may be mounted on, the main film substrate 100. The COF semiconductor package 1 may be any one of a COF semiconductor package 1a shown in FIG. 8, a COF semiconductor package 1b shown in FIG. 9, or a COF semiconductor package 1c shown in FIG. 10. The main film substrate 100 may be any one of a main film substrate 100-I shown in FIG. 3 or a main film substrate 100-II shown in FIG. 4. The sub-film substrate 200 may be any one of a sub-film substrate 200-I shown in FIG. 5B, a sub-film substrate 200-II shown in FIG. 6B, or a sub-film substrate 200-III shown in FIG. 7.

The main film substrate 100 may include a main base film 110 and a plurality of main conductive wires 130 arranged on at least one surface of the main base film 110. The main film substrate 100 may further include the main input pins 100IP arranged at or adjacent to a first edge of the main base film 110 and connected to the main conductive wires 130. The main film substrate 100 may further include the main output pins 100OP arranged at or adjacent to a second edge of the main base film 110, opposite to the first edge of the main base film 110, and connected to the main conductive wires 130. In an embodiment of the present inventive concept, the main film substrate 100 may further include a main protective layer 115 covering at least a portion of the main conductive wires 130 on the main base film 110. The main protective layer 115 might not cover the main input pins 100IP and the main output pins 100OP. The main protective layer 115 might not cover a portion of the main conductive wires 130.

The main base film 110 may include an insulating material. The main base film 110 may include, for example, a resin-based material containing polyimide, polyester, or other materials known in the art and may be flexible.

In an embodiment of the present inventive concept, the main protective layer 115 may be formed by applying a solder mask insulating ink onto the main base film 110 by using a screen printing method or an inkjet printing method and curing the solder mask insulating ink by using heat, ultraviolet (UV) light, or infrared (IR) light. In an embodiment of the present inventive concept, the main protective layer 115 may be formed by applying a photo-sensitive solder resist onto an entire film substrate or by adhering a film-type solder resist material onto the film substrate by using a laminating method. For example, the photo-sensitive solder resist may be applied to the film substrate by using a screen printing method or a spray coating method. The forming of the main protective layer 115 may further include removing unnecessary portions through exposure and development, and curing a remaining portion by using heat, UV light, or IR light.

The main conductive wires 130 may include a plurality of main input wires 130I and a plurality of main output wires 130O. The plurality of main input wires 130I may connect between the main input pins 100IP and the sub-film substrate 200. In an embodiment of the present inventive concept, the main protective layer 115 may cover a portion of the main input wires 130I and a portion of the main output wires 130O and might not cover the remaining portions of the main input wires 130I and the remaining portions of the main output wires 130O.

For example, the main input wires 130I may connect the main input pins 100IP and a plurality of sub input wires 230I to each other. The main output wires 130O may connect the main output pins 100OP and the sub-film substrate 200 to each other. For example, the main output wires 130O may connect the main output pins 100OP and a plurality of sub output wires 230O to each other.

The main input pins 100IP, the main output pins 100OP, and the main conductive wires 130 may include, for example, aluminum foil or copper foil or may be formed by patterning a metal layer that is formed on the main base film 110 through casting, laminating, or electroplating.

In an embodiment of the present inventive concept, the main input pins 100IP and the main output pins 100OP may be portions of the main conductive wires 130 or may be portions of the main conductive wires 130 plated with, for example, tin (Sb), gold (Au), nickel (Ni), or lead (Pb). In an embodiment of the present inventive concept, the main input pins 100IP and the main output pins 100OP are electrically connected to the main conductive wires 130 and may include a separately formed conductive material.

The main conductive wires 130 may extend along one surface of the main base film 110, but the present inventive concept is not limited thereto. For example, at least some of the main conductive wires 130 may extend along one surface of the main base film 110, may penetrate through the main base film 110, and may further extend along the other surface of the main base film 110. In an embodiment of the present inventive concept, when the main conductive wires 130 are formed on both surfaces of the main base film 110, conductive vias penetrating through the main base film 110 and electrically connecting the main conductive wires 130 formed on both surfaces of the main base film 110 may be formed. The main input pins 100IP and the main output pins 100OP may be arranged on one surface of the main base film 110, but the present inventive concept is not limited thereto. In an embodiment of the present, the main input pins 100IP may be arranged on one surface of the main base film 110, and the main output pins 100OP may be arranged on the other surface of the main base film 110.

The main film substrate 100 may have a module attachment region 120R. The main protective layer 115 might not cover at least a portion of the main conductive wires 130 arranged on one surface of the main base film 110 in the module attachment region 120R. For example, at least a portion of the main input wires 130I and at least a portion of the main output wires 130O arranged on one surface of the main base film 110 in the module attachment region 120R may be exposed by not being covered by the main protective layer 115. The main film substrate 100 may include at least two module attachment regions 120R, which include a first module attachment region 120RA and a second module attachment region 120RB that are spaced apart from each other. For example, the main film substrate 100 may have as many module attachment regions 120R as the number of sub-modules 10 mounted on the main film substrate 100.

The sub-film substrate 200 may include a sub base film 210 and a plurality of sub conductive wires 230 arranged on at least one surface of the sub base film 210. The sub-film substrate 200 may further include a plurality of sub input pins 200IP arranged at or adjacent to a first edge of the sub base film 210 and connected to the sub conductive wires 230. The sub-film substrate 200 may further include a plurality of sub output pins 200OP arranged at or adjacent to a second edge of the sub base film 210 opposite to the first edge of the sub base film 210 and connected to the sub conductive wires 230. In an embodiment of the present inventive concept, the sub-film substrate 200 may further include a sub protective layer 215 covering at least a portion of the sub conductive wires 230 on the sub base film 210. The sub protective layer 215 might not cover the sub input pins 200IP and the sub output pins 200OP. The sub protective layer 215 might not cover a portion of the sub conductive wires 230.

The sub base film 210 may include an insulating material. The sub base film 210 may include, for example, a resin-based material including polyimide, polyester, or other materials known in the art and may be flexible.

In an embodiment of the present inventive concept, the sub protective layer 215 may be formed by applying a solder mask insulating ink onto the sub base film 210 by using a screen printing method or an inkjet printing method and curing the solder mask insulating ink by using heat, UV, or IR. In an embodiment of the present inventive concept, the sub protective layer 215 may be formed by applying a photo-sensitive solder resist onto an entire film substrate by using a screen printing method or a spray coating method, or by adhering a film-type solder resist material onto the film substrate by using a laminating method. The method of forming the sub protective layer 215 further includes removing unnecessary portions through exposure and development, and curing a remaining portion by using heat, UV, or IR.

The sub conductive wires 230 may include the sub input wires 230I and the sub output wires 230O. The sub input wires 230I may connect the sub input pins 200IP and the semiconductor chip 300 to each other. In an embodiment of the present inventive concept, the sub protective layer 215 may cover a portion of the sub input wires 230I and a portion of the sub output wires 230O and might not cover the remaining portions of the sub input wires 230I and the remaining portions of the sub output wires 230O.

For example, the sub input wires 230I may connect the sub input pins 200IP and a plurality of chip terminals (310 of FIG. 5B, 6B, or 7) included in the semiconductor chip 300 to each other. The sub output wires 230O may connect the sub output pins 200OP and the semiconductor chip 300 to each other. For example, the sub output wires 230O may connect the sub output pins 200OP and the chip terminals (310 of FIG. 5B, 6B, or 7) included in the semiconductor chip 300 to each other.

The sub input pins 200IP, the sub output pins 200OP, and sub conductive wires 230 may include, for example, aluminum foil or copper foil or may be formed by patterning a metal layer that is formed on the sub base film 210 through casting, laminating, or electroplating.

In an embodiment of the present inventive concept, the sub input pins 200IP and the sub output pins 200OP may be portions of the sub conductive wires 230 or may be portions of the sub conductive wires 230 plated with Sb, Au, Ni, or Pb. In an embodiment of the present inventive concept, the sub input pins 200IP and the sub output pins 200OP are electrically connected to the sub conductive wires 230 and may include a separately formed conductive material.

The COF semiconductor package 1 may include at least two sub-film substrates 200 including the first sub-film substrate 200A and the second sub-film substrate 200B. The COF semiconductor package 1 may include the at least two semiconductor chips 300 including the first semiconductor chip 300A and the second semiconductor chip 300B. For example, the first semiconductor chip 300A may be mounted on the first sub-film substrate 200A, and the second semi-conductor chip 300B may be mounted on the second sub-film substrate 200B.

The first sub-film substrate 200A and the second sub-film substrate 200B may have the same or similar configuration as each other. For example, when the number and the arrangement of the chip terminals (310 of FIG. 5B, 6B, or 7) of the first semiconductor chip 300A are substantially identical to the number and the arrangement of the chip terminals (310 of FIG. 5B, 6B, or 7) of the second semi-conductor chip 300B, the first sub-film substrate 200A and the second sub-film substrate 200B may have substantially the same configuration as each other. For example, when the number and the arrangement of the chip terminals (310 of FIG. 5B, 6B, or 7) of the first semiconductor chip 300A are different from the number and the arrangement of the chip terminals (310 of FIG. 5B, 6B, or 7) of the second semi-conductor chip 300B, the first sub-film substrate 200A and the second sub-film substrate 200B may have configurations similar to each other overall except for differences of the numbers and arrangements of the sub input pins 200IP, the sub output pins 200OP, and the sub conductive wires 230 and the sizes of the sub base film 210.

Therefore, in this specification, except for cases of describing that the first semiconductor chip 300A is mounted on the first sub-film substrate 200A and the second semi-conductor chip 300B is mounted on the second sub-film substrate 200B, the first sub-film substrate 200A and the second sub-film substrate 200B may each be referred to as the sub-film substrate 200 without distinction.

The COF semiconductor package 1 may include the at least two semiconductor chips 300 including the first semi-conductor chip 300A and the second semiconductor chip 300B. For example, the first semiconductor chip 300A and the second semiconductor chip 300E may each be a DDI. In an embodiment of the present inventive concept, one of the first semiconductor chip 300A or the second semiconductor chip 300B may be connected to the gate lines of the display panel 500 shown in FIGS. 1A and 1B and serve as a gate driver, whereas the other one may be connected to the source lines of the display panel 500 and serve as a source driver. For example, the first semiconductor chip 300A may be connected to the gate lines of the display panel 500 and serve as a gate driver, and the second semiconductor chip 300B may be connected to the source lines of the display panel 500 and serve as a source driver. In addition or alternatively, the second semiconductor chip 300B may be connected to the gate lines of the display panel 500 and serve as a gate driver, and the first semiconductor chip 300A may be connected to the source lines of the display panel 500 and serve as a source driver.

After the semiconductor chips 300 are mounted on the sub-film substrate 200, the sub-film substrate 200 having the semiconductor chips 300 mounted thereon may be mounted on the main film substrate 100. For example, the first semiconductor chip 300A is mounted on the first sub-film substrate 200A, and the second semiconductor chip 300B is mounted on the second sub-film substrate 200B. Thereafter, the first sub-film substrate 200A having the first semicon-ductor chip 300A mounted thereon and the second sub-film substrate 200B having the second semiconductor chip 300B mounted thereon may be attached to the main film substrate 100 together, thereby forming the COF semiconductor pack-age 1.

The sub-modules 10, which are the sub-film substrates 200 having the semiconductor chips 300 mounted thereon, may include the first sub-module 10A and the second sub-module 10B. The first sub-module 10A may be the first sub-film substrate 200A having the first semiconductor chip 300A mounted thereon, and the second sub-module 10B may be the second sub-film substrate 200B having the second semiconductor chip 300B mounted thereon. The first sub-module 10A may be attached to the first module attach-ment region 120RA of the main film substrate 100, and the second sub-module 10B may be attached to the second module attachment region 120RB of the main film substrate 100.

The first semiconductor chip 300A and the second semi-conductor chip 300B may receive input signals from the driving circuit chips 410 mounted on the driver PCB 400 shown in FIG. 1A through driving connection wires 430, the main input wires 130I, the sub input pins 200IP, and the sub input wires 230I and may transmit output signals to the image region 520 shown in FIG. 1A through the sub input wires 230O, the sub output pins 200OP, the main output wires 130O, the main output pins 100OP, and the panel connection wires 530 shown in FIG. 1A.

The first sub-module 10A and the second sub-module 10B may be attached onto the main film substrate 100, such that the long axis of the first semiconductor chip 300A and the long axis of the second semiconductor chip 300E extend in the same direction (e.g., a first horizontal direction (X direction)) and are spaced apart from each other in a second horizontal direction (Y direction) orthogonal to the first horizontal direction (X direction). The second horizontal direction (Y direction) may be the same direction as a direction in which the short axis of the first semiconductor chip 300A and the short axis of the second semiconductor chip 300B extend. In an embodiment of the present inven-tive concept, the first sub-module 10A and the second sub-module 10B may be attached onto the main film sub-strate 100 to be partially offset (e.g., misaligned) from each other. For example, the first sub-module 10A and the second sub-module 10B may be attached onto the main film sub-strate 100 such that the first sub-module 10A and the second sub-module 10B are spaced apart from each other in the second horizontal direction (Y direction) and partially offset from each other in the second horizontal direction (Y direction).

The first sub-module 10A and the second sub-module 10B may be attached onto the main film substrate 100 to be spaced apart from each other. The first sub-module 10A and the second sub-module 10B may be spaced apart from each other by a first separation interval IV1 in the second hori-zontal direction (Y direction). The first separation interval IV1 may be less than about 8 mm.

The COF semiconductor package 1 according to the present inventive concept may be formed by, instead of attaching the first semiconductor chip 300A and the second semiconductor chip 300B directly onto the main film sub-strate 100, respectively attaching the first semiconductor chip 300A and the second semiconductor chip 300B to the first sub-film substrate 200A and the second sub-film sub-strate 200B and attaching the first sub-module 10A, which is the first sub-film substrate 200A having the first semicon-ductor chip 300A mounted thereon, and the second sub-module 10B, which is the second sub-film substrate 200B having the second semiconductor chip 300B mounted thereon, to the main film substrate 100.

When the first semiconductor chip 300A and the second semiconductor chip 300B are attached directly onto a film substrate (e.g., the main film substrate 100), deformation, like warpage, may occur in a portion of the main conductive wires 130 during attachment of the first semiconductor chip 300A onto the main film substrate 100, and thus, a defect may occur during attachment of the second semiconductor chip 300B onto the main film substrate 100. In addition or alternatively, when the first semiconductor chip 300A and the second semiconductor chip 300E are arranged adjacent to each other, during a process of attaching the second semiconductor chip 300B to the main film substrate 100 after the first semiconductor chip 300A is attached to the main film substrate 100, the first semiconductor chip 300A may be damaged. Therefore, it is desirable to provide a sufficient separation interval between the first semiconductor chip 300A and the second semiconductor chip 300B.

However, in the process of forming the COF semiconductor package 1 according to the present inventive concept, when the semiconductor chip 300 is attached to a film substrate (e.g., the sub-film substrate 200), only one first semiconductor chip 300A is attached to the first sub-film substrate 200A, and only one second semiconductor chip 300B is attached to the second sub-film substrate 200B. In addition, since the first sub-film substrate 200A and the second sub-film substrate 200B are attached to the main film substrate 100, the first sub-module 10A including the first sub-film substrate 200A and the second sub-module 10B including the second sub-film substrate 200E may be simultaneously attached onto the main film substrate 100. Therefore, it is possible to prevent deformation of a portion of the main conductive wires 130, like warpage, or damage to the first semiconductor chip 300A.

Therefore, in the COF semiconductor package 1 according to an embodiment of the present inventive concept, the main conductive wires 130, the sub conductive wires 230, and the chip terminals (310 of FIG. 5B, 6B, or 7) included in the semiconductor chips 300 may be implemented with fine pitches without a defect or damage during formation of the COF semiconductor package 1.

Figure 3:
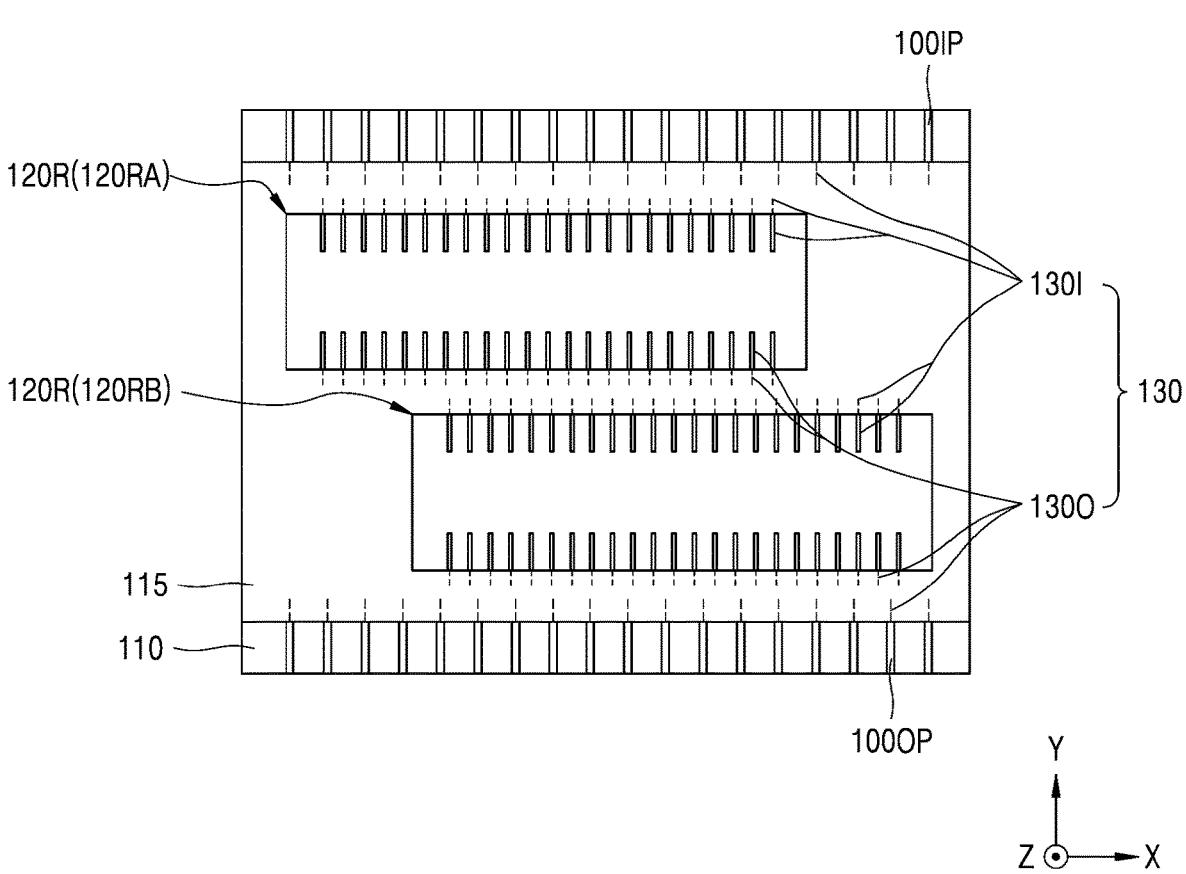
FIG. 3 is a schematic plan view of main film substrates included in a chip-on-film semiconductor package according to an embodiment of the present inventive concept.
Figure 4:
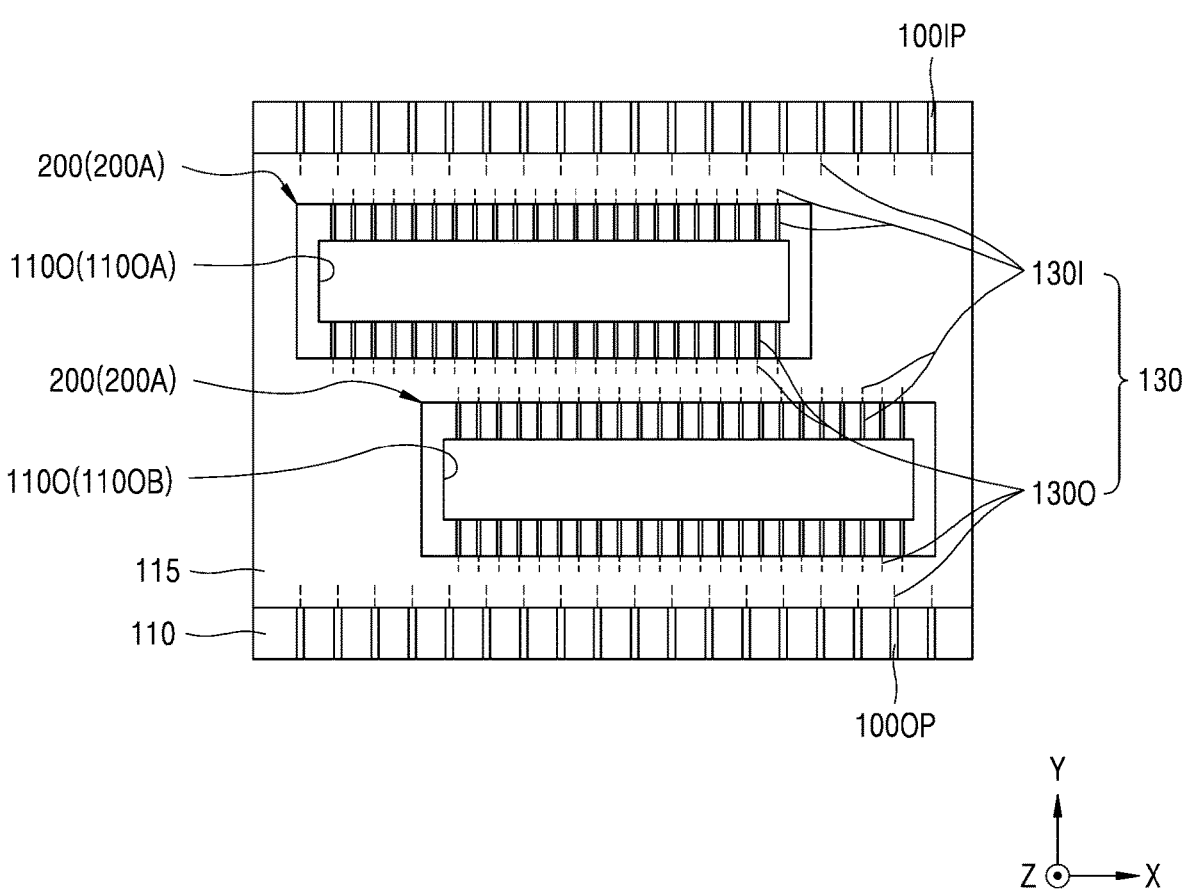
FIG. 4 is a schematic plan view of main film substrates included in a chip-on-film semiconductor package according to an embodiment of the present inventive concept.

FIGS. 3 and 4 are schematic plan views of main film substrates included in a chip-on-film semiconductor package according to an embodiment of the present inventive concept.

Referring to FIGS. 3 and 4 together, main film substrates 100-I and 100-II may each include the main base film 110, the main conductive wires 130 arranged on at least one surface of the main base film 110, and the main protective layer 115 covering at least a portion of the main conductive wires 130 on the main base film 110. The main film substrates 100-I and 100-II may each correspond to the main film substrate 100 shown in FIGS. 1A, 2A, and 2B, and, in the descriptions of FIG. 3, descriptions identical or substantially identical to those discussed above with reference to FIGS. 1A, 2A, and 2B may be omitted.

The main film substrates 100-I and 100-II may each have the module attachment region 120R. The main protective layer 115 might not cover at least a portion of the main conductive wires 130 arranged on one surface of the main base film 110 in the module attachment region 120R. For example, at least a portion of the main input wires 130I and at least a portion of the main output wires 130O arranged on one surface of the main base film 110 in the module attachment region 120R may be exposed by not being covered by the main protective layer 115. The module attachment region 120R may include the first module attachment region 120RA and the second module attachment region 120RB that are spaced apart from each other.

In the main film substrate 100-I shown in FIG. 3, the main base film 110 may be disposed throughout the module attachment region 120R. The main film substrate 100-II shown in FIG. 4 may have film openings 110O, which penetrate through portions of the main base film 110, in the module attachment region 120R. In other words, the main film substrate 100-I shown in FIG. 3 does not have the film openings 110O as shown in FIG. 4, but the main film substrate 100-II shown in FIG. 4 may have the film openings 110O.

The film openings 110O penetrating through the main base film 110 may be formed in portions of the module attachment region 120R, and portions of the main base film 110, in which at least a portion of the main input wires 130I and a portion of the main output wires 130O are arranged, may be arranged in the remaining portion of the module attachment region 120R. In an embodiment of the present inventive concept, the film openings 110O may be formed to be spaced apart from edges of the module attachment region 120R and penetrate through the main base film 110.

The film openings 110O may include a first film opening 110OA and a second film opening 110OB. The main film substrate 100-II may have the first film opening 110OA in the first module attachment region 120RA and the second film opening 110OB in the second module attachment region 120RB.

Figure 5A:
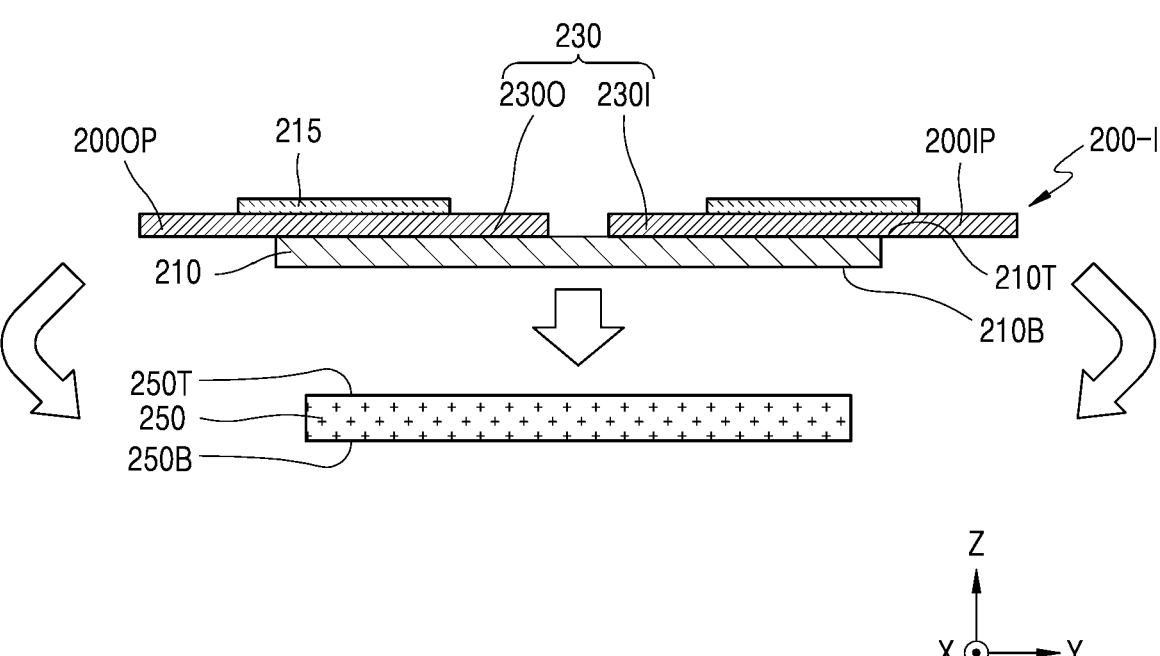
FIG. 5A is a schematic cross-sectional view of a sub-film substrate included in a COF semiconductor package according to an embodiment of the present inventive concept.
Figure 5B:
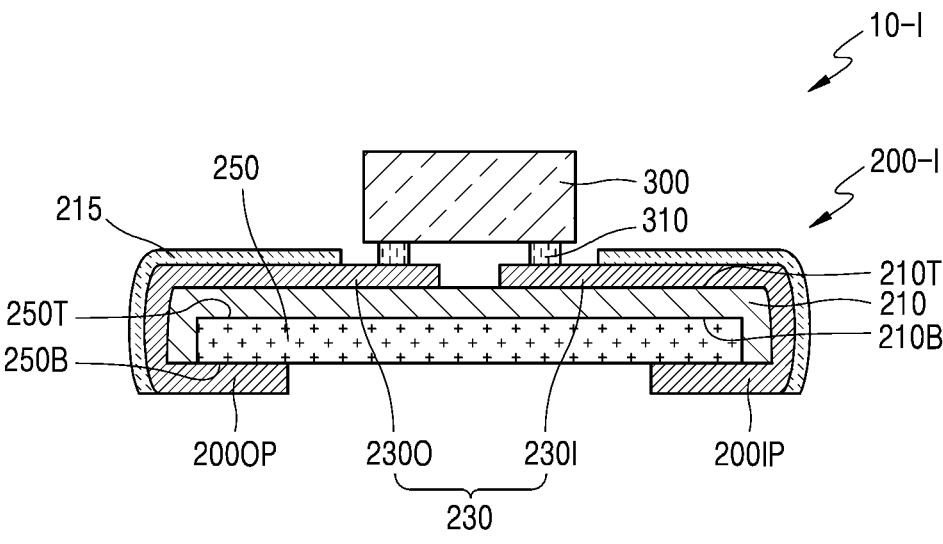
FIG. 5B is a schematic cross-sectional view of a sub-film substrate, having a semiconductor chip mounted thereon, included in a COF semiconductor package according to an embodiment of the present inventive concept.

FIG. 5A is a schematic cross-sectional view of a sub-film substrate included in a COF semiconductor package according to an embodiment of the present inventive concept, and FIG. 5B is a schematic cross-sectional view of a sub-film substrate, having a semiconductor chip mounted thereon, included in the COF semiconductor package according to an embodiment of the present inventive concept.

Referring to FIGS. 5A and 5B together, the sub-film substrate 200-I may include the sub base film 210 and the sub conductive wires 230 arranged on the sub base film 210. The sub-film substrate 200-I may correspond to the sub-film substrate 200 shown in FIGS. 1A, 2A, and 2B, and, in the descriptions of FIGS. 5A and 5B, descriptions identical to those given above with reference to FIGS. 1A, 2A, and 2B may be omitted.

The sub base film 210 may have a first surface 210T and a second surface 210B that are opposite to each other. The first surface 210T and the second surface 210B of the sub base film 210 may also be referred to as a first sub-surface 210T and a second sub-surface 210B, respectively.

The sub conductive wires 230 may include the sub input wires 230I and the sub output wires 230O. The sub conductive wires 230 may be arranged on the first surface 210T of the sub base film 210. In an embodiment of the present inventive concept, the sub conductive wires 230 may be arranged only on the first surface 210T of the sub base film 210 and might not be arranged on the second surface 210B of the sub base film 210; however, the present inventive concept is not limited thereto.

The sub-film substrate 200-I may further include the sub input pins 200IP arranged adjacent to a first edge of the sub base film 210 and connected to the sub conductive wires 230. The sub-film substrate 200-I may further include the sub output pins 200OP arranged adjacent to a second edge of the sub base film 210 opposite to the first edge of the sub base film 210 and connected to the sub conductive wires 230. In an embodiment of the present inventive concept, the sub input pins 200IP and the sub output pins 200OP may be arranged at outer positions adjacent to the first edge and the second edge, respectively, of the sub base film 210 to be overhang with respect to the sub base film 210. In other words, the sub base film 210 might not be below the sub input pins 200IP and the sub output pins 200OP. For example, the sub base film 210 might not vertically overlap the sub input pins 200IP and the sub output pins 200OP.

In an embodiment of the present inventive concept, the sub-film substrate 200-I may further include the sub protective layer 215 covering at least a portion of the sub conductive wires 230 that are disposed on the sub base film 210. The sub protective layer 215 might not cover the sub input pins 200IP and the sub output pins 200OP. The sub protective layer 215 might not cover a portion of the sub conductive wires 230. In an embodiment of the present inventive concept, the protective layer 215 may cover a portion of the sub output pins 200OP and a portion of the sub input pins 200IP.

The sub-film substrate 200-I may be attached to a stiffener 250. The stiffener 250 may have a first surface 250T and a second surface 250B that are opposite to each other. The first surface 250T and the second surface 250B of the stiffener 250 may also be referred to as a first stiffening surface 250T and a second stiffening surface 250B, respectively. The stiffener 250 may include a core unit including an insulating material or a conductive material and an insulating material covering the surface of the core unit. In an embodiment of the present inventive concept, the stiffener 250 may be a heat dissipation plate that performs a heat dissipation function.

The horizontal width of the sub-film substrate 200-I may be greater than the horizontal width of the stiffener 250 in the short axis-wise direction of the semiconductor chip 300 (i.e., the second horizontal direction (Y direction)). The sub-film substrate 200-I may be bent, such that the second surface 210B of the sub base film 210 covers the first surface 250T and side surfaces of the stiffener 250 and may be attached to the stiffener 250. The side surfaces of the stiffener 250 may connect the first surface 250T and the second surface 250B of the stiffener 250 to each other. The second surface 210B of the sub base film 210 may cover both side surfaces of the stiffener 250 that are opposite to each other in the second horizontal direction (Y direction). The sub-film substrate 200-I may be attached to the stiffener 250, such that the sub input pins 200IP and the sub output pins 200OP are arranged on the second surface 250B of the stiffener 250.

The sub-film substrate 200-I may be attached to the stiffener 250 by bending both end portions of the sub-film substrate 200-I opposite to each other in the second horizontal direction (Y direction) and having respectively arranged thereon the sub input pins 200IP and the sub output pins 200OP, such that the sub input wires 230I and the sub output wires 230O are arranged on the first surface 250T of the stiffener 250 and the sub input pins 200IP and the sub output pins 200OP are arranged on the second surface 250B of the stiffener 250.

A plurality of chip terminals 310 may be arranged on one surface of the semiconductor chip 300. The semiconductor chip 300 may be attached to the sub-film substrate 200-I, such that the chip terminals 310 are connected to the sub conductive wires 230, which are arranged on the first surface 210T of the sub base film 210, on the first surface 250T of the stiffener 250. The chip terminals 310 are connected to portions of the sub conductive wires 230 that are not covered by the sub protective layer 215. Some of the chip terminals 310 may be connected to the sub input wires 230I, and some other of the chip terminals 310 may be connected to the sub output wires 230O.

The sub-film substrate 200-I, having the semiconductor chip 300 mounted thereon, may be referred to as a sub-module 10-I. The sub-module 10-I may include the sub-film substrate 200-I, the stiffener 250, and the semiconductor chip 300. The semiconductor chip 300 may face a direction different from a direction that the sub input pins 200IP and the sub output pins 200OP face, in the vertical direction (Z direction). For example, in the sub-module 10-I, the semiconductor chip 300 may face upward, and the sub input pins 200IP and the sub output pins 200OP may face downward. In an embodiment of the present inventive concept, the sub-module 10-I may be attached to the main film substrate 100-I shown in FIG. 3.

Figure 6A:
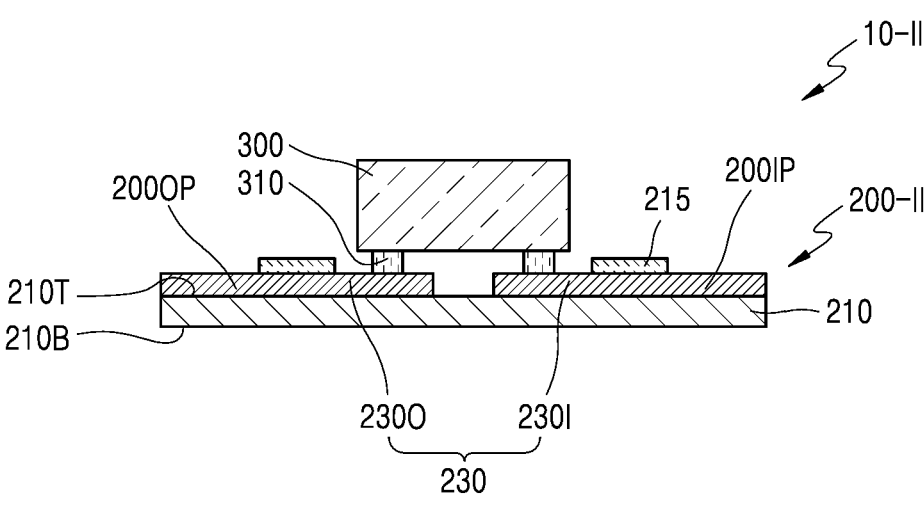
FIGS. 6A and 6B are schematic cross-sectional views of a sub-film substrate, having a semiconductor chip mounted thereon, included in a COF semiconductor package according to an embodiment of the present inventive concept.
Figure 6B:
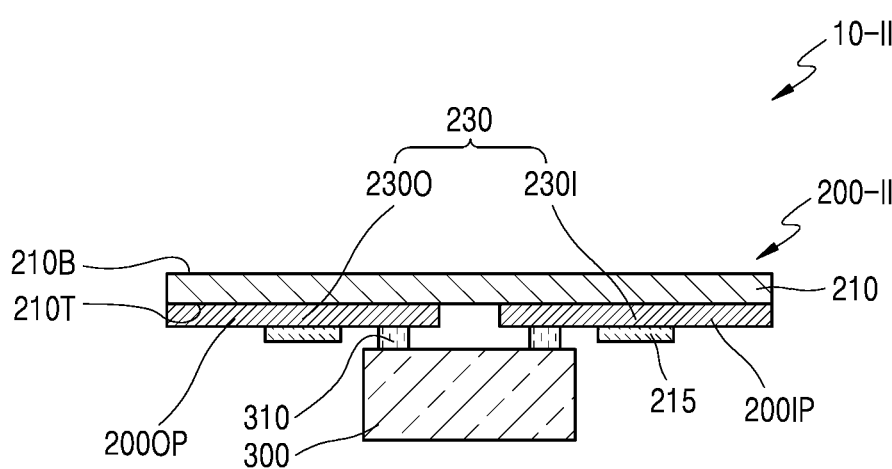
Figure 6B:
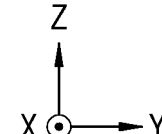

FIGS. 6A and 6B are schematic cross-sectional views of a sub-film substrate, having a semiconductor chip mounted thereon, included in a COF semiconductor package according to an embodiment of the present inventive concept.

Referring to FIGS. 6A and 6B together, the sub-film substrate 200-II may include the sub base film 210 and the sub conductive wires 230 arranged on the sub base film 210. The sub-film substrate 200-II may correspond to the sub-film substrate 200 shown in FIGS. 1A, 2A, and 2B, and, in the descriptions of FIGS. 6A and 6B, descriptions identical to those given above with reference to FIGS. 1A, 2A, and 2B may be omitted.

The sub base film 210 may have the first surface 210T and the second surface 210B that are opposite to each other. The sub conductive wires 230 may include the sub input wires 230I and the sub output wires 230O. The sub conductive wires 230 may be arranged on the first surface 210T of the sub base film 210. In an embodiment of the present inventive concept, the sub conductive wires 230 may be arranged only on the first surface 210T of the sub base film 210 and might not be arranged on the second surface 210B of the sub base film 210.

The sub-film substrate 200-II may further include the sub input pins 200IP arranged adjacent to the first edge of the sub base film 210 and connected to the sub conductive wires 230. The sub-film substrate 200-II may further include the sub output pins 200OP arranged adjacent to the second edge of the sub base film 210 opposite to the first edge of the sub base film 210 and connected to the sub conductive wires 230. In an embodiment of the present inventive concept, the sub input pins 200IP and the sub output pins 200OP may be arranged on the first surface 210T of the sub-film substrate 200-II. In other words, the sub base film 210 may be positioned below the sub input pins 200IP and the sub output pins 200OP.

In an embodiment of the present inventive concept, the sub-film substrate 200-II may further include the sub protective layer 215 covering at least a portion of the sub conductive wires 230 on the sub base film 210. The sub protective layer 215 might not cover the sub input pins 200IP and the sub output pins 200OP. In an embodiment of the present inventive concept, the sub protective layer 215 might not cover a portion of the sub conductive wires 230.

The chip terminals 310 may be arranged on one surface of the semiconductor chip 300. The semiconductor chip 300 may be attached to the sub-film substrate 200-II, such that the chip terminals 310 are connected to portions of the sub conductive wires 230, which are arranged on the first surface 210T of the sub base film 210 and are not covered by the sub protective layer 215. Some of the chip terminals 310 may be connected to the sub input wires 230I, and other chip terminals 310 may be connected to the sub output wires 230O.

The sub-film substrate 200-II, having the semiconductor chip 300 mounted thereon, may be referred to as a sub-module 10-II. The sub-module 10-II may include the sub-film substrate 200-II, the stiffener 250, and the semiconductor chip 300. The semiconductor chip 300 may face the same direction that the sub input pins 200IP and the sub output pins 200OP face, in the vertical direction (Z direction).

In an embodiment of the present inventive concept, the sub-module 10-II may be attached to the main film substrate 100-II shown in FIG. 4. The sub-module 10-II may be turned upside down and attached to the main film substrate 100-II shown in FIG. 4. For example, in the process of forming the sub-module 10-II, the semiconductor chip 300, the sub input pins 200IP, and the sub output pins 200OP face upward as shown in FIG. 6A. However, in the process of attaching the sub-module 10-II to the main film substrate 100-II shown in FIG. 4, the semiconductor chip 300, the sub input pins 200IP, and the sub output pins 200OP may face downward as shown in FIG. 6B.

Figure 7:
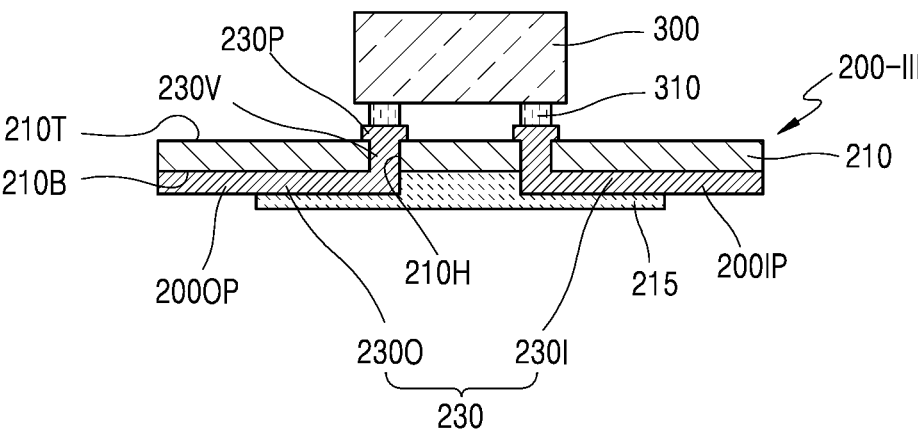
FIG. 7 is a schematic cross-sectional view of a sub-film substrate, having a semiconductor chip mounted thereon, included in a COF semiconductor package according to an embodiment of the present inventive concept.
Figure 7:
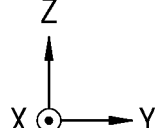

FIG. 7 is a schematic cross-sectional view of a sub-film substrate having mounted thereon a semiconductor chip included in a COF semiconductor package according to an embodiment of the present inventive concept.

Referring to FIG. 7 together, the sub-film substrate 200-III may include the sub base film 210 and the sub conductive wires 230 arranged on the sub base film 210. The sub-film substrate 200-III may correspond to the sub-film substrate 200 shown in FIGS. 1A, 2A, and 2B, and, in the descriptions of FIG. 7, descriptions identical to those given above with reference to FIGS. 1A, 2A, and 2B may be omitted.

The sub base film 210 may have the first surface 210T and the second surface 210B that are opposite to each other. The first surface 210T and the second surface 210B of the sub base film 210 may also be referred to as the first sub-surface 210T and the second sub-surface 210B, respectively.

The sub conductive wires 230 may include the sub input wires 230I and the sub output wires 230O. The sub conductive wires 230 may be arranged on the first surface 210T and second surface 210B of the sub base film 210. In an embodiment of the present inventive concept, the sub conductive wires 230 may be arranged only on the first surface 210T of the sub base film 210 and might not be arranged on the second surface 210B of the sub base film 210.

The sub-film substrate 200-III may further include the sub input pins 200IP arranged adjacent to the first edge of the sub base film 210 and connected to the sub conductive wires 230. The sub-film substrate 200-III may further include the sub output pins 200OP arranged adjacent to the second edge of the sub base film 210 opposite to the first edge of the sub base film 210 and connected to the sub conductive wires 230. In an embodiment of the present inventive concept, the sub input pins 200IP and the sub output pins 200OP may be arranged on the second surface 210B of the sub-film substrate 200-III. In other words, the sub base film 210 may be positioned above the sub input pins 200IP and the sub output pins 200OP.

The sub conductive wires 230 may be formed on both the first surface 210T and the second surface 210B of the sub base film 210. The sub conductive wires 230 may each include a pad 230P disposed on the first surface 210T of the sub base film 210 and a via 230V connected to the pad 230P and penetrating through the sub base film 210. The sub conductive wires 230 may extend along the second surface 210B of the sub base film 210 from vias 230V and may be connected to the sub input pins 200IP and the sub output pins 200OP.

Although FIG. 7 shows that portions of the sub conductive wires 230, excluding pads 230P and the vias 230V, extend along the second surface 210B of the sub base film 210, the present inventive concept is not limited thereto. In an embodiment of the present inventive concept, a portion of each of the sub conductive wires 230 may extend along the first surface 210T of the sub base film 210. For example, a first edge of each of the sub conductive wires 230 may be connected to the pad 230P, a second edge of each of the sub conductive wires 230 may be connected to the via 230V, and each of the sub conductive wires 230 may extend along the first surface 210T of the sub base film 210.

The sub conductive wires 230 may include the sub input wires 230I and the sub output wires 230O. The sub input wires 230I may connect the sub input pins 200IP and the semiconductor chip 300 to each other.

In an embodiment of the present inventive concept, the sub-film substrate 200-III may further include the sub protective layer 215 covering at least a portion of the sub conductive wires 230 on the sub base film 210. The sub protective layer 215 might not cover portions of the sub input pins 200IP and the sub output pins 200OP. The sub protective layer 215 might not cover a portion of the sub conductive wires 230. In an embodiment of the present inventive concept, the sub protective layer 215 may cover a portion of the sub input wires 230I and a portion of the sub output wires 230O and might not cover the remaining portions of the sub input wires 230I and the remaining portions of the sub output wires 230O.

When a portion of each of the sub conductive wires 230 extends along the second surface 210B of the sub base film 210, the sub protective layer 215 may be disposed on the second surface 210B of the sub base film 210. When a portion of each of the sub conductive wires 230 extends along the first surface 210T of the sub base film 210, the sub protective layer 215 may be disposed on the first surface 210T of the sub base film 210. When portions of the sub conductive wires 230 extend along the first surface 210T and the second surface 210B of the sub base film 210, sub protective layers 215 may be disposed on the first surface 210T and the second surface 210E of the sub base film 210, respectively.

The chip terminals 310 may be arranged on one surface of the semiconductor chip 300. The semiconductor chip 300 may be attached to the sub-film substrate 200-III, such that the chip terminals 310 are connected to the pads 230P of the sub conductive wires 230, which are arranged on the first surface 210T of the sub base film 210. Some of the chip terminals 310 may be connected to the sub input wires 230I, and other chip terminals 310 may be connected to the sub output wires 230O.

The sub-film substrate 200-III, having the semiconductor chip 300 mounted thereon, may be referred to as a sub-module 10-III. The sub-module 10-III may include the sub-film substrate 200-III and the semiconductor chip 300. For example, the semiconductor chip 300 may face the same direction that the sub input pins 200IP and the sub output pins 200OP face, in the vertical direction (Z direction). For example, the semiconductor chip 300, the sub input pins 200IP, and the sub output pins 200OP may face upward. In an embodiment of the present inventive concept, the sub-module 10-III may be attached to the main film substrate 100-I shown in FIG. 3.

Figure 8:
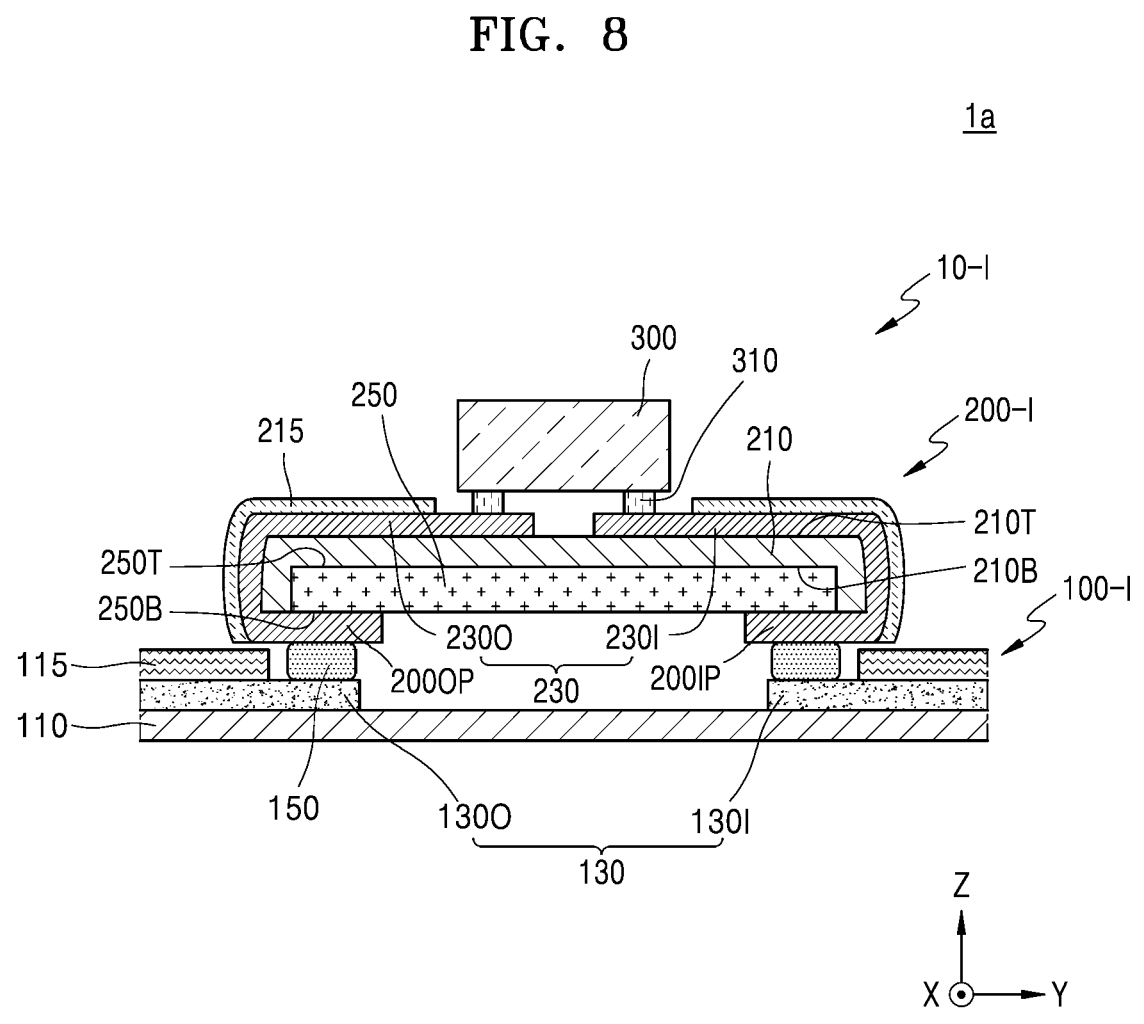

FIG. 8 is a schematic cross-sectional view of a COF semiconductor package according to an embodiment of the present inventive concept.

Referring to FIG. 8, the COF semiconductor package 1a may include the main film substrate 100-I and the sub-module 10-I. The sub-module 10-I may include the sub-film substrate 200-I and the semiconductor chip 300 mounted on the sub-film substrate 200-I. The sub-module 10-I may be mounted on the main film substrate 100-I. The main film substrate 100-I may correspond to the main film substrate 100-I shown in FIG. 3, and the sub-film substrate 200-I and the sub-module 10-I may correspond to the sub-film substrate 200-I and the sub-module 10-I shown in FIG. 5B, respectively.

In the sub-module 10-I, the semiconductor chip 300 may be disposed on the first surface 250T of the stiffener 250. In the sub-module 10-I, the sub input pins 200IP and the sub output pins 200OP may be arranged on the second surface 250B of the stiffener 250. The sub input pins 200IP may be arranged at a first edge of the stiffener 250, and the sub output pins 200OP may be arranged at a second edge, opposite to the first edge, of the stiffener 250.

A connection conductive layer 150 may be provided between the main film substrate 100-I and the sub-module 10-I. The connection conductive layer 150 may be provided between the main film substrate 100-I and the sub-film substrate 200-I of the sub-module 10-I. The connection conductive layer 150 may electrically connect the main film substrate 100-I and the sub-module 10-I. The sub input pins 200IP and the sub output pins 200OP may be respectively connected to the main input wires 130I and the main output wires 130O of the main film substrate 100-I by the connection conductive layer 150. For example, the connection conductive layer 150 may include an anisotropic conductive film or an anisotropic conductive paste. In an embodiment of the present inventive concept, the COF semiconductor package 1a may include at least two connection conductive layers 150 provided between the main film substrate 100-I and one sub-module 10-I. One of the at least two connection conductive layers 150 may be provided between the main input wires 130I and the sub input pins 200IP and may electrically connect the main input wires 130I and the sub input pins 200IP corresponding to each other. The other of the at least two connection conductive layers 150 may be provided between the main output wires 130O and the sub output pins 200OP and may electrically connect the main output wires 130O and the sub output pins 200OP corresponding to each other.

Figure 9:
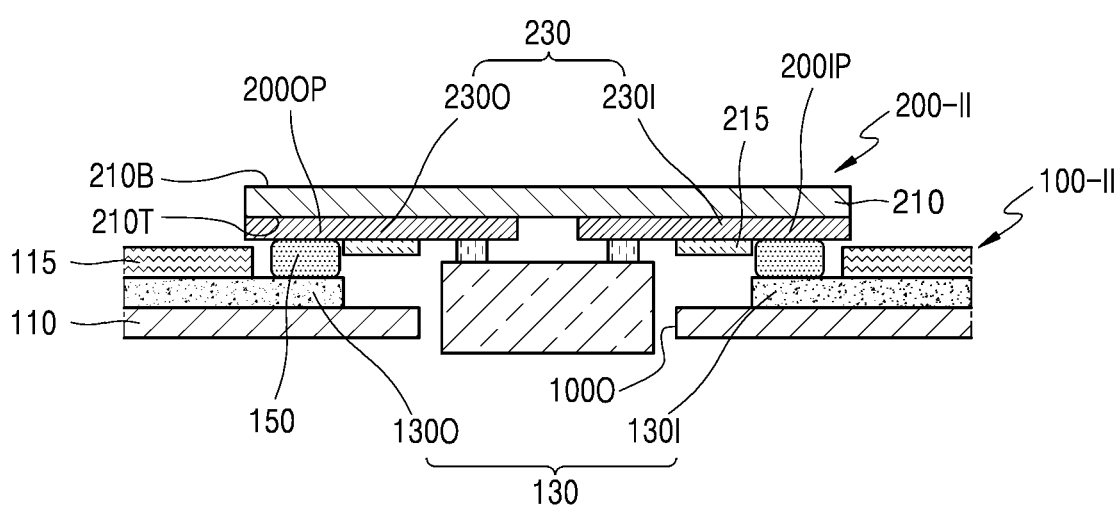
FIG. 9 is a schematic cross-sectional view of a COF semiconductor package according to an embodiment of the present inventive concept.
Figure 9:
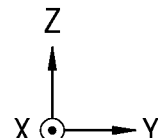

FIG. 9 is a schematic cross-sectional view of a COF semiconductor package according to an embodiment of the present inventive concept.

Referring to FIG. 9, the COF semiconductor package 1b may include the main film substrate 100-II and the sub-module 10-II. The sub-module 10-II may include the sub-film substrate 200-II and the semiconductor chip 300 mounted on the sub-film substrate 200-II. The sub-module 10-II may be mounted on the main film substrate 100-II. The main film substrate 100-II may correspond to the main film substrate 100-II shown in FIG. 4, and the sub-film substrate 200-I and the sub-module 10-II may correspond to the sub-film substrate 200-II and the sub-module 10-II shown in FIG. 6B, respectively.

In the sub-module 10-II, the semiconductor chip 300 may be disposed on the first surface 210T of the sub base film 210. In the sub-module 10-II, the sub input pins 200IP and the sub output pins 200OP may be arranged on the first surface 210T of the sub base film 210. The sub input pins 200IP may be arranged at a first edge of the sub base film 210, and the sub output pins 200OP may be arranged at a second edge, opposite to the first edge, of the sub base film 210. In the sub-module 10-II, the first surface 210T of the sub base film 210 faces toward the main film substrate 100-II, and the sub-module 10-II may be mounted on the sub-film substrate 200-II.

The connection conductive layer 150 may be provided between the main film substrate 100-II and the sub-module 10-II. The connection conductive layer 150 may be provided between the main film substrate 100-II and the sub-film substrate 200-II of the sub-module 10-II. The connection conductive layer 150 may electrically connect the main film substrate 100-II and the sub-module 10-II to each other. The sub input pins 200IP and the sub output pins 200OP may be respectively connected to the main input wires 130I and the main output wires 130O of the main film substrate 100-II by the connection conductive layer 150. In an embodiment of the present inventive concept, the COF semiconductor package 1b may include at least two connection conductive layers 150 provided between the main film substrate 100-II and one sub-module 10-II. One of the at least two connection conductive layers 150 may be provided between the main input wires 130I and the sub input pins 200IP and may electrically connect the main input wires 130I and the sub input pins 200IP corresponding to each other. The other of the at least two connection conductive layers 150 may be provided between the main output wires 130O and the sub output pins 200OP and may electrically connect the main output wires 130O and the sub output pins 200OP corresponding to each other.

When the sub-module 10-II is mounted on the main film substrate 100-II, a portion of the semiconductor chip 300 may be positioned in the film opening 110O of the main base film 110. In other words, the semiconductor chip 300 may penetrate through the main base film 110 through the film opening 110O and protrude downward from the main base film 110. Therefore, the top surface of the semiconductor chip 300 on which the chip terminals 310 are arranged may be located at a vertical level higher than that of the top surface of the main base film 110, and the bottom surface of the semiconductor chip 300 may be located at a vertical level lower than that of the bottom surface of the main base film 110.

Figure 10:
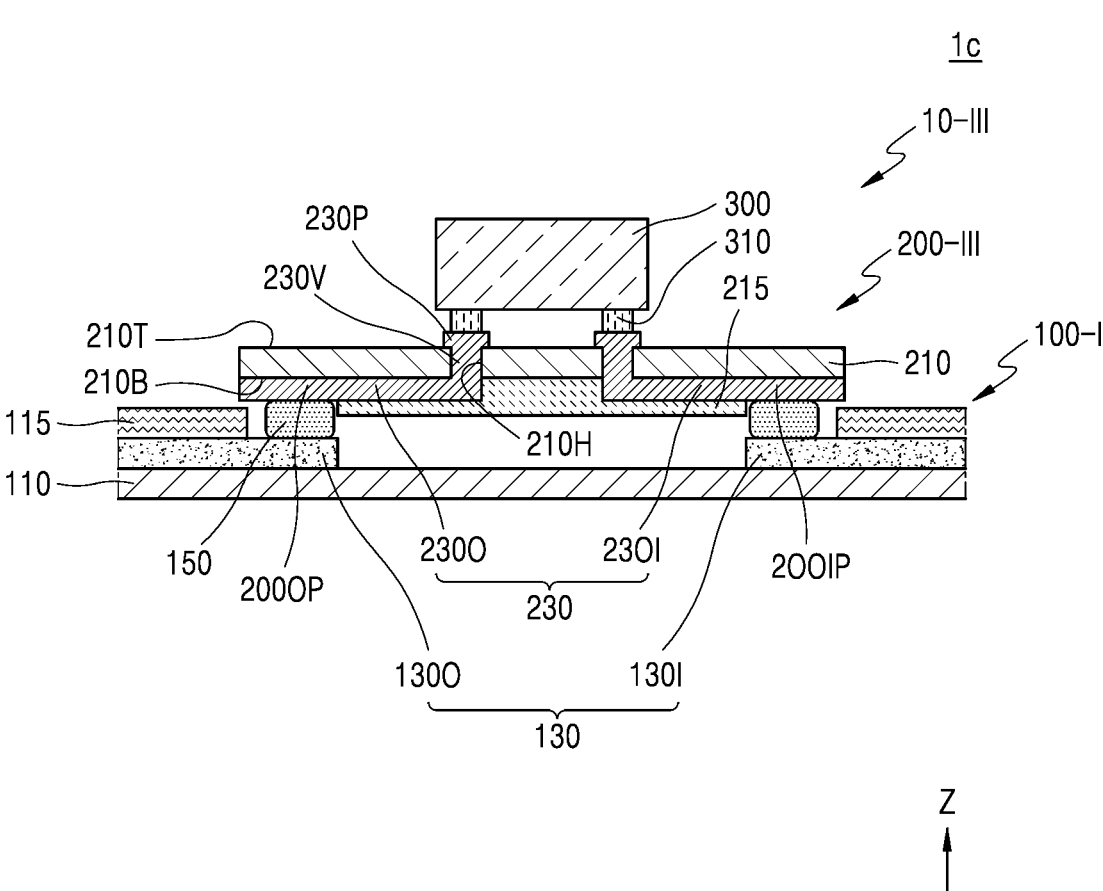
FIG. 10 is a schematic cross-sectional view of a COF semiconductor package according to an embodiment of the present inventive concept.

FIG. 10 is a schematic cross-sectional view of a COF semiconductor package according to an embodiment of the present inventive concept.

Referring to FIG. 10, the COF semiconductor package 1c may include the main film substrate 100-I and the sub-module 10-III. The sub-module 10-III may include the sub-film substrate 200-III and the semiconductor chip 300 mounted on the sub-film substrate 200-III. The sub-module 10-III may be mounted on the main film substrate 100-I. The main film substrate 100-I may correspond to the main film substrate 100-I shown in FIG. 3, and the sub-film substrate 200-III and the sub-module 10-III may correspond to the sub-film substrate 200-III and the sub-module 10-III shown in FIG. 7, respectively.

In the sub-module 10-III, the semiconductor chip 300 may be disposed on the first surface 210T of the sub base film 210. In the sub-module 10-III, the sub input pins 200IP and the sub output pins 200OP may be arranged on the second surface 210B of the sub base film 210. The sub input pins 200IP may be arranged at a first edge of the sub base film 210, and the sub output pins 200OP may be arranged at a second edge, opposite to the first edge, of the sub base film 210. In the sub-module 10-III, the second surface 210B of the sub base film 210 faces toward the main film substrate 100-I, and the sub-module 10-III may be mounted on the sub-film substrate 200-III.

The connection conductive layer 150 may be provided between the main film substrate 100-I and the sub-module 10-III. The connection conductive layer 150 may be provided between the main film substrate 100-I and the sub-film substrate 200-III of the sub-module 10-III. The connection conductive layer 150 may electrically connect the main film substrate 100-I and the sub-module 10-III to each other. The sub input pins 200IP and the sub output pins 200OP may be respectively connected to the main input wires 130I and the main output wires 130O of the main film substrate 100-I by the connection conductive layer 150. In an embodiment of the present inventive concept, the COF semiconductor package 1c may include at least two connection conductive layers 150 provided between the main film substrate 100-I and one sub-module 10-III. One of the at least two connection conductive layers 150 may be provided between the main input wires 130I and the sub input pins 200IP and may electrically connect the main input wires 130I and the sub input pins 200IP corresponding to each other. The other of the at least two connection conductive layers 150 may be provided between the main output wires 130O and the sub output pins 200OP and may electrically connect the main output wires 130O and the sub output pins 200OP corresponding to each other.

Figure 11:
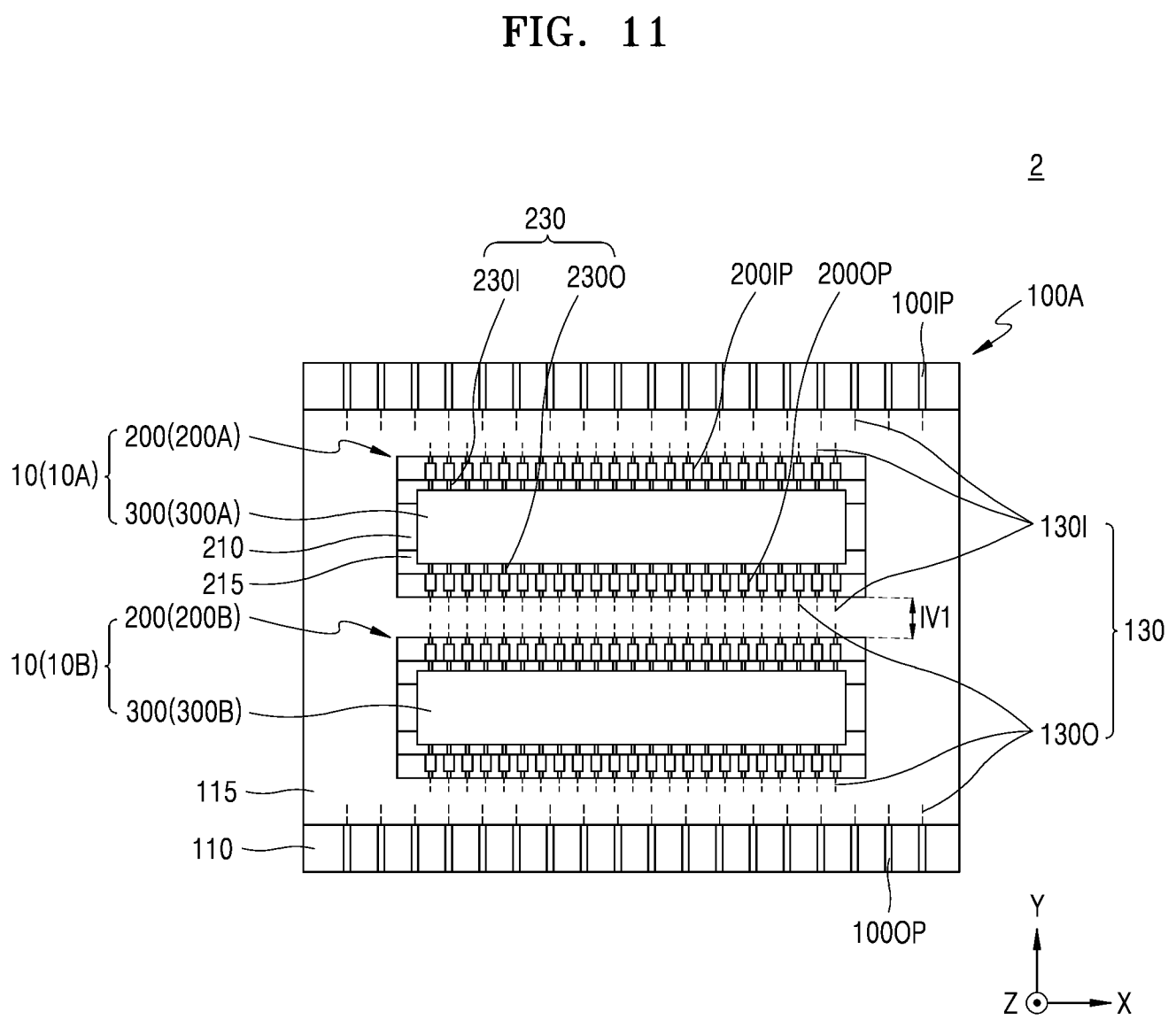

FIG. 11 is a schematic plan view of a COF semiconductor package according to an embodiment of the present inventive concept. In descriptions of FIG. 11, descriptions identical to those already given above with reference to FIG. 2A may be omitted.

Referring to FIG. 11, a COF semiconductor package 2 may include a main film substrate 100A, the sub-film substrate 200, and the semiconductor chip 300. The semiconductor chips 300 may be mounted on the sub-film substrate 200, and the sub-film substrate 200, having the semiconductor chips 300 mounted thereon, may be mounted on the main film substrate 100A. The COF semiconductor package 2 may be any one of the COF semiconductor package 1a shown in FIG. 8, the COF semiconductor package 1b shown in FIG. 9, or the COF semiconductor package 1c shown in FIG. 10.

The main film substrate 100A may include the main base film 110 and the main conductive wires 130 arranged on at least one surface of the main base film 110.

The COF semiconductor package 2 may include at least two sub-film substrates 200 including the first sub-film substrate 200A and the second sub-film substrate 200B. The COF semiconductor package 2 may include the at least two semiconductor chips 300 including the first semiconductor chip 300A and the second semiconductor chip 300B. For example, the first semiconductor chip 300A may be mounted on the first sub-film substrate 200A, and the second semiconductor chip 300B may be mounted on the second sub-film substrate 200B.

After the semiconductor chips 300 are mounted on the sub-film substrate 200, the sub-film substrate 200, having the semiconductor chips 300 mounted thereon, may be mounted on the main film substrate 100A. For example, the first semiconductor chip 300A is mounted on the first sub-film substrate 200A, and the second semiconductor chip 300B is mounted on the second sub-film substrate 200B. Thereafter, the first sub-film substrate 200A, having the first semiconductor chip 300A mounted thereon, and the second sub-film substrate 200B, having the second semiconductor chip 300B mounted thereon, may be attached to the main film substrate 100A together, thereby forming the COF semiconductor package 2.

The first sub-module 10A and the second sub-module 10B may be attached onto the main film substrate 100A, such that the long axis of the first semiconductor chip 300A and the long axis of the second semiconductor chip 300B extend in the same direction (e.g., a first horizontal direction (X direction)) as each other and are spaced apart from each other in the second horizontal direction (Y direction). In an embodiment of the present inventive concept, the first sub-module 10A and the second sub-module 10B may be attached onto the main film substrate 100A to be aligned with each other in the second horizontal direction (Y direction) orthogonal to the first horizontal direction (X direction). For example, the first sub-module 10A and the second sub-module 10B may be attached onto the main film substrate 100A to be spaced apart from each other in the second horizontal direction (Y direction) and aligned with each other in the first horizontal direction (X direction).

The first sub-module 10A and the second sub-module 10B may be attached onto the main film substrate 100A and may be spaced apart from each other. The first sub-module 10A and the second sub-module 10B may be spaced apart from each other by the first separation interval IV1 in the second horizontal direction (Y direction). The first separation interval IV1 may be less than about 8 mm.

Figure 12:
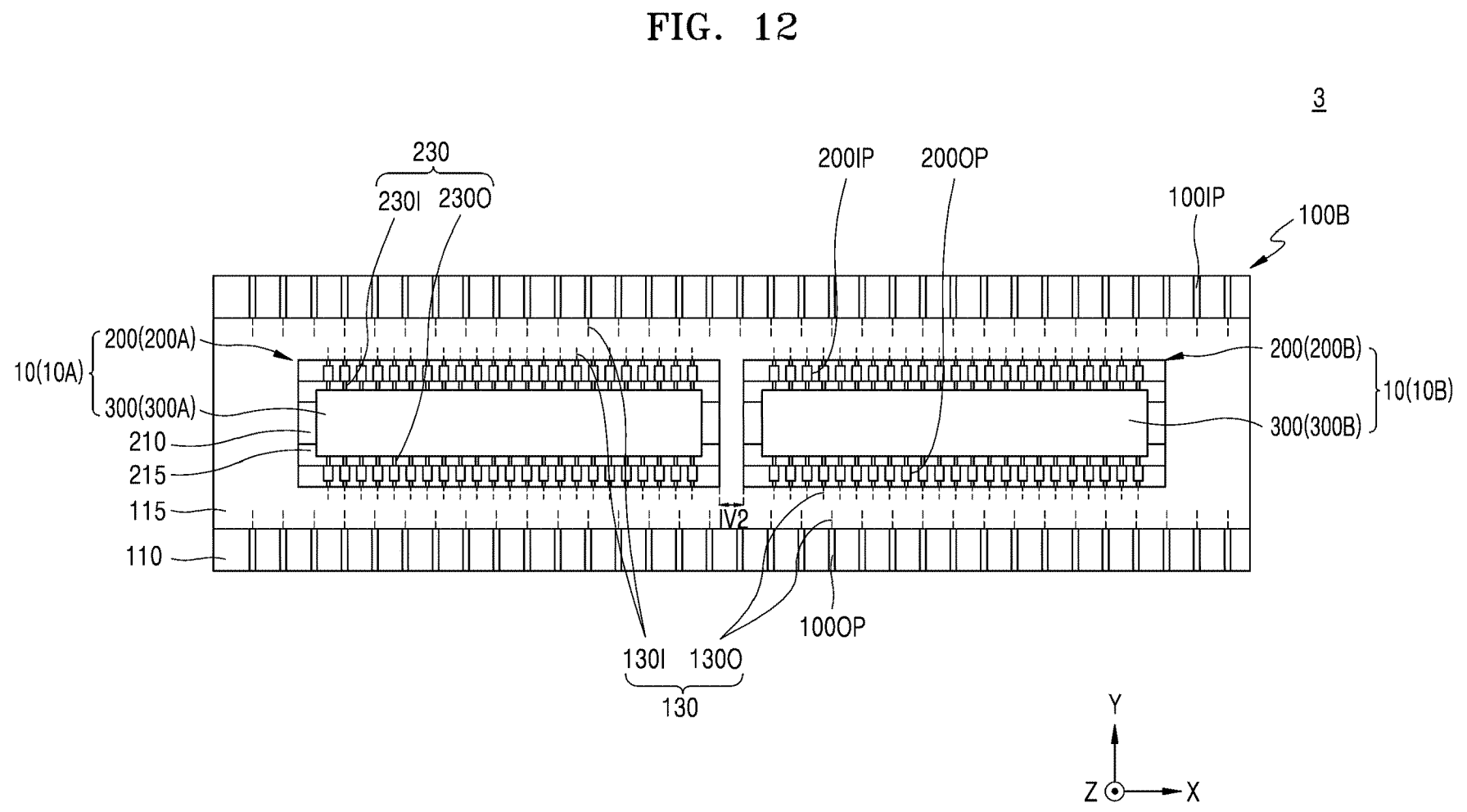

FIG. 12 is a schematic plan view of a COF semiconductor package according to an embodiment of the present inventive concept. In descriptions of FIG. 12, descriptions identical to those already given above with reference to FIG. 2A may be omitted.

Referring to FIG. 12, a COF semiconductor package 3 may include a main film substrate 100B, the sub-film substrate 200, and the semiconductor chip 300. The semiconductor chips 300 may be mounted on the sub-film substrate 200, and the sub-film substrate 200, having the semiconductor chips 300 mounted thereon, may be mounted on the main film substrate 100B. The COF semiconductor package 3 may be any one of the COF semiconductor package 1a shown in FIG. 8, the COF semiconductor package 1b shown in FIG. 9, or the COF semiconductor package 1c shown in FIG. 10.

The main film substrate 100B may include the main base film 110 and the main conductive wires 130 arranged on at least one surface of the main base film 110.

The COF semiconductor package 3 may include at least two sub-film substrates 200 including the first sub-film substrate 200A and the second sub-film substrate 200B. The COF semiconductor package 3 may include the at least two semiconductor chips 300 including the first semiconductor chip 300A and the second semiconductor chip 300B. For example, the first semiconductor chip 300A may be mounted on the first sub-film substrate 200A, and the second semiconductor chip 300B may be mounted on the second sub-film substrate 200B.

After the semiconductor chips 300 are mounted on the sub-film substrate 200, the sub-film substrate 200, having the semiconductor chips 300 mounted thereon, may be mounted on the main film substrate 100B. For example, the first semiconductor chip 300A is mounted on the first sub-film substrate 200A, and the second semiconductor chip 300B is mounted on the second sub-film substrate 200B. Thereafter, the first sub-film substrate 200A, having the first semiconductor chip 300A mounted thereon, and the second sub-film substrate 200B, having the second semiconductor chip 300B mounted thereon, may be attached to the main film substrate 100B together, thereby forming the COF semiconductor package 3.

The first sub-module 10A and the second sub-module 10B may be attached onto the main film substrate 100B, such that the long axis of the first semiconductor chip 300A and the long axis of the second semiconductor chip 300B are aligned with each other in the same direction (e.g., a first horizontal direction (X direction)) and are spaced apart from each other in the second horizontal direction (Y direction). In an embodiment of the present inventive concept, the first sub-module 10A and the second sub-module 10B may be attached onto the main film substrate 100E to be aligned with each other in the first horizontal direction (X direction). For example, the first sub-module 10A and the second sub-module 10B may be attached onto the main film substrate 100B, and may be spaced apart from each other in the first horizontal direction (X direction) and aligned with each other in the first horizontal direction (X direction).

The first sub-module 10A and the second sub-module 10B may be attached onto the main film substrate 100E and may be spaced apart from each other. The first sub-module 10A and the second sub-module 10B may be spaced apart from each other by a second separation interval IV2 in the first horizontal direction (X direction). The second separation interval IV2 may be less than about 5 mm.

Figure 13:
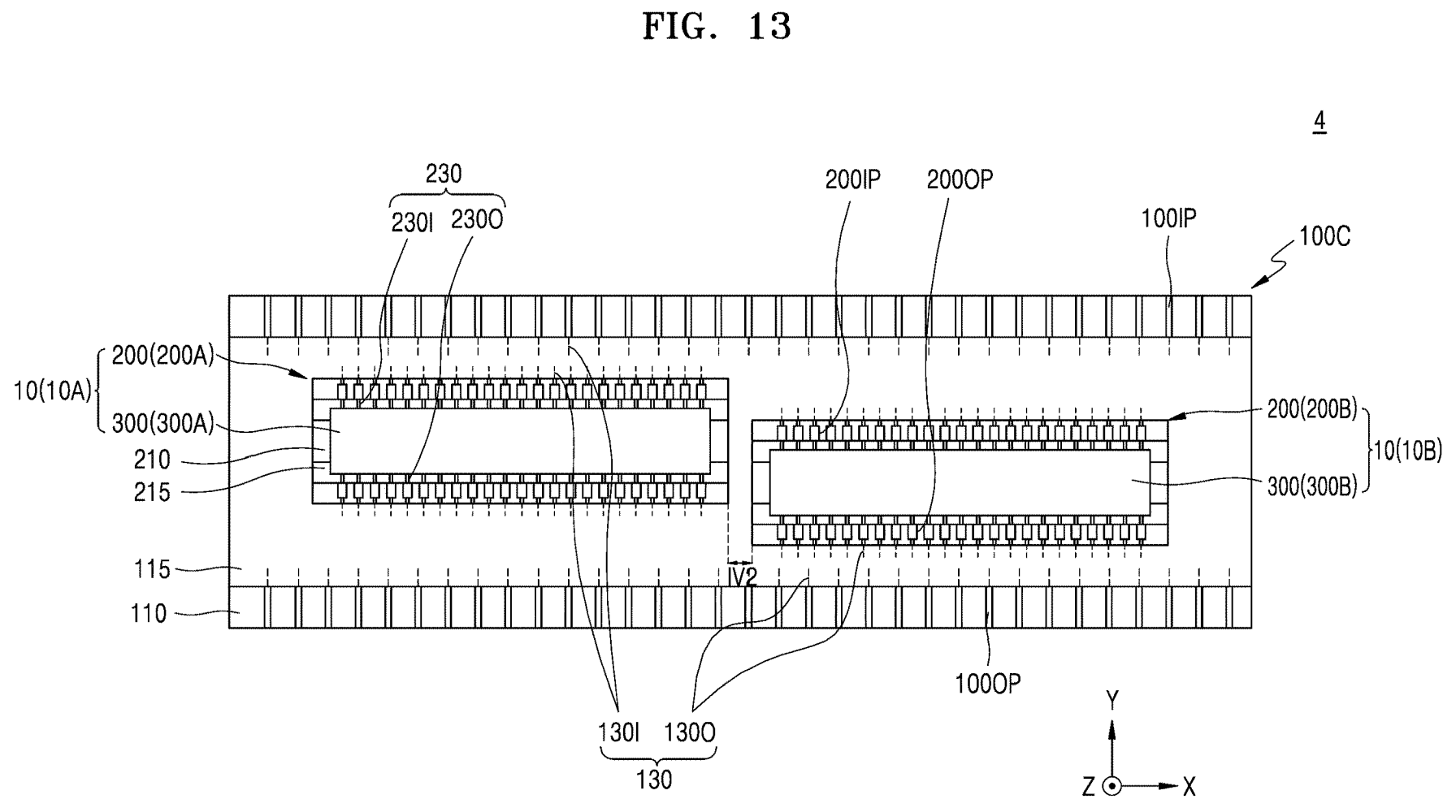

FIG. 13 is a schematic plan view of a COF semiconductor package according to an embodiment of the present inventive concept. In descriptions of FIG. 13, descriptions identical to those already given above with reference to FIG. 2A may be omitted.

Referring to FIG. 11, a COF semiconductor package 4 may include a main film substrate 1000, the sub-film substrate 200, and the semiconductor chip 300. The semiconductor chips 300 may be mounted on the sub-film substrate 200, and the sub-film substrate 200, having the semiconductor chips 300 mounted thereon, may be mounted on the main film substrate 100C. The COF semiconductor package 4 may be any one of the COF semiconductor package 1a shown in FIG. 8, the COF semiconductor package 1b shown in FIG. 9, or the COF semiconductor package 1c shown in FIG. 10.

The main film substrate 100C may include the main base film 110 and the main conductive wires 130 arranged on at least one surface of the main base film 110.

The COF semiconductor package 4 may include at least two sub-film substrates 200 including the first sub-film substrate 200A and the second sub-film substrate 200B. The COF semiconductor package 4 may include the at least two semiconductor chips 300 including the first semiconductor chip 300A and the second semiconductor chip 300B. For example, the first semiconductor chip 300A may be mounted on the first sub-film substrate 200A, and the second semiconductor chip 300B may be mounted on the second sub-film substrate 200B.

After the semiconductor chips 300 are mounted on the sub-film substrate 200, the sub-film substrate 200, having the semiconductor chips 300 mounted thereon, may be mounted on the main film substrate 1000. For example, the first semiconductor chip 300A is mounted on the first sub-film substrate 200A, and the second semiconductor chip 300B is mounted on the second sub-film substrate 200B. Thereafter, the first sub-film substrate 200A, having the first semiconductor chip 300A mounted thereon, and the second sub-film substrate 200B, having the second semiconductor chip 300B mounted thereon, may be attached to the main film substrate 100C together, thereby forming the COF semiconductor package 4.

The first sub-module 10A and the second sub-module 10B may be attached onto the main film substrate 100C, such that the long axis of the first semiconductor chip 300A and the long axis of the second semiconductor chip 300B extend in the same direction (e.g., the first horizontal direction (X direction)) and are spaced apart from each other in the first horizontal direction (X direction). In an embodiment of the present inventive concept, the first sub-module 10A and the second sub-module 10B may be attached onto the main film substrate 100C and may be partially offset (e.g., misaligned) from each other. For example, the first sub-module 10A and the second sub-module 10B may be attached onto the main film substrate 100C such that the first sub-module 10A and the second sub-module 10B are spaced apart from each other in the first horizontal direction (X direction) and are partially offset from each other in the first horizontal direction (X direction).

The first sub-module 10A and the second sub-module 10B may be attached onto the main film substrate 100C and may be spaced apart from each other. The first sub-module 10A and the second sub-module 10B may be spaced apart from each other by the second separation interval IV2 in the first horizontal direction (X direction). The second separation interval IV2 may be less than about 5 mm.

Figure 14:
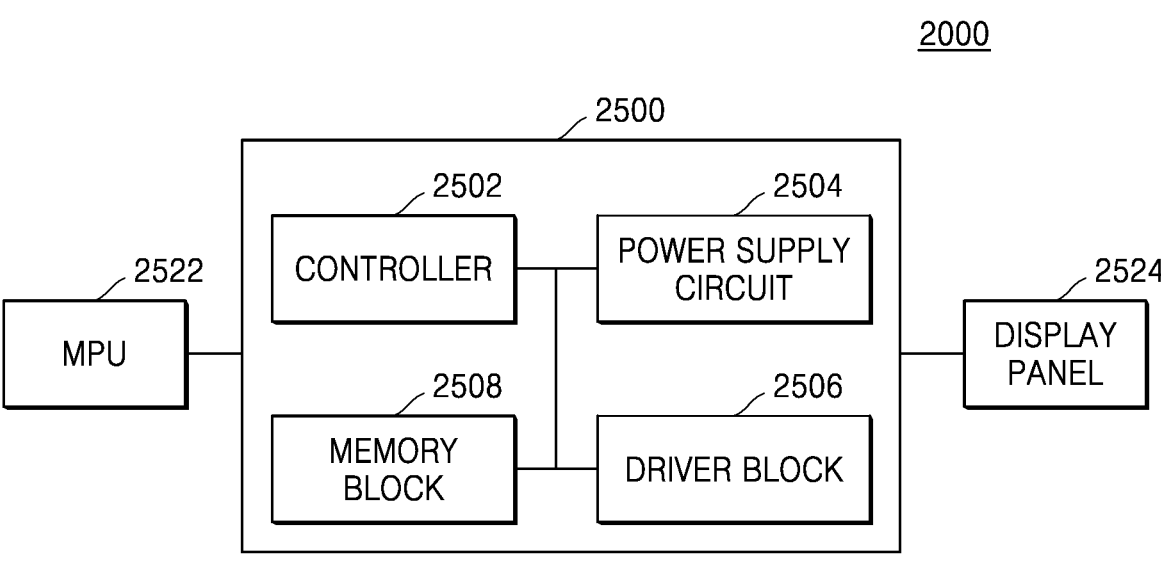
FIG. 14 is a schematic block diagram showing a display apparatus according to an embodiment of the present inventive concept.

FIG. 14 is a schematic block diagram showing a display apparatus according to an embodiment of the present inventive concept.

Referring to FIG. 14, a display apparatus 2000 may include a main processing unit (MPU) 2522, a DDI 2500, and a display panel 2524. The display panel 2524 may include, for example, an LCD panel, a PDP, or an OLED display panel.

The DDI 2500 may include a controller 2502, a power supply circuit 2504, a driver block (e.g., circuit) 2506, and a memory block 2508. The controller 2502 receives and decodes a command applied from the MPU 2522 and controls blocks of the DDI 2500 to implement an operation according to the command from the MPU 2522. The power supply circuit 2504 generates a driving voltage in response to a control of the controller 2502. The driver block 2506 drives the display panel 2524 by using the driving voltage generated by the power supply circuit 2504 in response to a control of the controller 2502. The memory block 2508 is a block for temporarily storing commands input to the controller 2502 or control signals output from the controller 2502, or for storing data. The memory block 2508 may include a memory like RAM or ROM.

The DDI 2500 may include at least one of COF semiconductor packages 1, 1a, 1b, 1c, 2, 3, and/or 4 according to an embodiment of the present inventive concept described above with reference to FIGS. 1 to 13 or COF semiconductor packages modified therefrom.

The driver block 2506 may be or a part of at least one of the semiconductor chip 300 included in the COF semiconductor packages 1, 1a, 1b, 1c, 2, 3, and 4 according to an embodiment of the present inventive concept described above with reference to FIGS. 1 to 13 or semiconductor chips modified therefrom.

While the present inventive concept has been described with reference to embodiments thereof, it will be understood by those of ordinary skill in the art that various changes in form and details may be made thereto without departing from the spirit and scope of the present inventive concept.

What is claimed is:

1. A chip-on-film (COF) semiconductor package comprising:

a main film substrate having at least two module attachment regions spaced apart from each other;

at least two sub-modules respectively attached to the at least two module attachment regions and spaced apart from each other on the main film substrate, wherein each of the at least two sub-modules comprises a sub-film substrate and a semiconductor chip mounted on the sub-film substrate; and at least two connection conductive layers provided between the main film substrate and the sub-film substrate, which is included in each of the at least two sub-modules, and electrically connecting the main film substrate to the at least two sub-modules, wherein the main film substrate comprises a main base film; a plurality of main conductive wires comprising: a plurality of main input wires and a plurality of main output wires; and a plurality of main input pins and a plurality of main output pins, which are connected to the main conductive wires and are arranged at a first edge and a second edge of the main film substrate, respectively, wherein the sub-film substrate comprises a sub base film having a first sub-surface and a second sub-surface opposite to each other; a plurality of sub conductive wires comprising: a plurality of sub input wires and a plurality of sub output wires; and a plurality of sub input pins and a plurality of sub output pins, which are connected to the sub conductive wires and are arranged at a first edge and a second edge of the sub-film substrate, respectively, wherein the semiconductor chip comprises a plurality of chip terminals arranged on one surface of the semiconductor chip, wherein some of the chip terminals of the semiconductor chip are connected to the sub input wires, and other chip terminals of the semiconductor chip are connected to the sub output wires, and one of the at least two connection conductive layers is provided between the sub input pins and the main input wires, and another one of the at least two connection conductive layers is provided between the sub output pins and the main output wires.

2. The COF semiconductor package of claim 1, wherein each of the at least two sub-modules further comprises a stiffener having a first stiffening surface and a second stiffening surface opposite to each other, wherein the sub conductive wires are arranged on the first sub-surface of the sub base film, wherein the semiconductor chip is disposed on the first sub-surface of the sub base film that is disposed on the first stiffening surface of the stiffener, and wherein the sub-film substrate is attached to the stiffener, such that the second sub-surface of the sub base film covers the first stiffening surface and side surfaces of the stiffener, and the sub input pins and the sub output pins are arranged on the second stiffening surface of the stiffener.

3. The COF semiconductor package of claim 1, wherein the main film substrate comprises film openings penetrating through portions of the main base film in the at least two module attachment regions, respectively, wherein the sub conductive wires are arranged on the first sub-surface of the sub base film, wherein each of the at least two sub-modules is attached to the main film substrate, such that the first sub-surface of the sub base film faces the main film substrate, and wherein the semiconductor chip is disposed on the first sub-surface of the sub base film, passes through each of the film openings, and protrudes beyond the main base film.

4. The COF semiconductor package of claim 1, wherein the sub conductive wires comprise pads and vias, wherein the pads are disposed on the first sub-surface of the sub base film, wherein the vias are connected to the pads and penetrate through the sub base film, wherein the sub conductive wires extend from the vias and extend along the second sub-surface of the sub base film, and are connected to either the sub input pins or the sub output pins on the second sub-surface of the sub base film, wherein the chip terminals of the semiconductor chip are connected to the pads, respectively, and wherein each of the at least two sub-modules is attached to the main film substrate, such that the second sub-surface sub surface of the sub base film faces the main film substrate.

5. The COF semiconductor package of claim 1, wherein the at least two connection conductive layers comprise an anisotropic conductive film or an anisotropic conductive paste.

6. The COF semiconductor package of claim 1, wherein the at least two sub-modules comprise a first sub-module and a second sub-module, and wherein the first sub-module and the second sub-module are offset from each other in a first horizontal direction, which is a long axis-wise direction of the semiconductor chip, and are spaced apart from each other in a second horizontal direction that is orthogonal to the first horizontal direction.

7. The COF semiconductor package of claim 1, wherein the at least two sub-modules comprise a first sub-module and a second sub-module, and wherein the first sub-module and the second sub-module are aligned with each other in a first horizontal direction, which is a long axis-wise direction of the semiconductor chip, and are spaced apart from each other in a second horizontal direction that is orthogonal to the first horizontal direction.

8. The COF semiconductor package of claim 1, wherein the at least two sub-modules comprise a first sub-module and a second sub-module, and wherein the first sub-module and the second sub-module are spaced apart from each other in a first horizontal direction, which is a long axis-wise direction of the semiconductor chip, and are aligned with each other in the first horizontal direction.

9. The COF semiconductor package of claim 1, wherein the at least two sub-modules comprise a first sub-module and a second sub-module, and wherein the first sub-module and the second sub-module are spaced apart from each other in a first horizontal direction, which is a long axis-wise direction of the semiconductor chip, and are offset from each other in the first horizontal direction.

10. A chip-on-film (COF) semiconductor package comprising:

a main film substrate having at least two module attachment regions spaced apart from each other, wherein the main film substrate comprises:

a main base film;

a plurality of main conductive wires comprising a plurality of main input wires and a plurality of main output wires; and a plurality of main input pins and a plurality of main output pins, which are connected to the main conductive wires and are arranged at a first edge and a second edge of the main film substrate, respectively;

at least two sub-film substrates, each comprising:

a sub base film having a first sub-surface and a second sub-surface opposite to each other;

a plurality of sub conductive wires, which are arranged on at least one of the first sub-surface or the second sub-surface and comprise a plurality of sub input wires and a plurality of sub output wires; and a plurality of sub input pins and a plurality of sub output pins, which are connected to the sub conductive wires and are arranged at a first edge and a second edge of a corresponding one of the at least two sub-film substrates, respectively, wherein the at least two sub-film substrates are attached to the at least two module attachment regions, respectively;

at least two semiconductor chips respectively attached to the first sub-surfaces of the sub base films of the at least two sub-film substrates; and connection conductive layers arranged between the sub input pins of the at least two sub-film substrates and the main input pins of the main film substrate and between the sub output pins of the at least two sub-film substrates and the main output pins of the main film substrate.

11. The COF semiconductor package of claim 10, wherein the at least two sub-film substrates comprise a first sub-film substrate and a second sub-film substrate, and wherein the first sub-film substrate and the second sub-film substrate are offset from each other in a first horizontal direction, which is a long axis-wise direction of each semiconductor chip, and are spaced apart from each other by a separation interval less than about 8 mm in a second horizontal direction that is orthogonal to the first horizontal direction.

12. The COF semiconductor package of claim 10, wherein the at least two sub-film substrates comprise a first sub-film substrate and a second sub-film substrate, and wherein the first sub-film substrate and the second sub-film substrate are aligned with each other in a first horizontal direction, which is a long axis-wise direction of each semiconductor chip, and are spaced apart from each other by a separation interval less than about 8 mm in a second horizontal direction that is orthogonal to the first horizontal direction.

13. The COF semiconductor package of claim 10, wherein the at least two sub-film substrates comprise a first sub-film substrate and a second sub-film substrate, and wherein the first sub-film substrate and the second sub-film substrate are spaced apart from each other by a separation interval less than about 5 mm in a first horizontal direction, which is a long axis-wise direction of each semiconductor chip, and are aligned with each other in the first horizontal direction.

14. The COF semiconductor package of claim 10, wherein the at least two sub-film substrates comprise a first sub-film substrate and a second sub-film substrate, and wherein the first sub-film substrate and the second sub-film substrate are spaced apart from each other by a separation interval less than about 5 mm in a first horizontal direction, which is a long axis-wise direction of each semiconductor chip, and are offset from each other in the first horizontal direction.

15. The COF semiconductor package of claim 10, wherein the connection conductive layers comprise an anisotropic conductive film or an anisotropic conductive paste.

16. The COF semiconductor package of claim 10, wherein the at least two sub-film substrates comprise a first sub-film substrate and a second sub-film substrate, and wherein the at least two semiconductor chips comprise a first semiconductor chip and a second semiconductor chip, wherein the first semiconductor chip is attached to the first sub-film substrate, and the second semiconductor chip is attached to the second sub-film substrate, wherein the first semiconductor chip is a display driver integrated circuit (IC) performing a function of a gate driver, and wherein the second semiconductor chip is a display driver IC performing a function of a source driver.

17. A display apparatus comprising:

a display panel comprising:

a transparent substrate;

an image region formed on the transparent substrate; and a plurality of panel connection wires; and a chip-on-film (COF) semiconductor package comprising:

a main film substrate having a first module attachment region and a second module attachment region spaced apart from each other;

a first sub-module and a second sub-module, which are respectively attached to the first module attachment region and the second module attachment region of the main film substrate, and each of the first sub-module and the second sub-module comprises a sub-film substrate and a semiconductor chip mounted on the sub-film substrate; and connection conductive layers arranged between sub-film substrates of the first sub-module and the second sub-module and the main film substrate, and electrically connecting each of the first sub-module and the second sub-module to the main film substrate, wherein the main film substrate comprises:

a main base film;

a plurality of main conductive wires arranged on at least one surface of the main base film and comprising a plurality of main input wires and a plurality of main output wires; and a plurality of main input pins and a plurality of main output pins connected to the main conductive wires and respectively arranged at a first edge and a second edge of the main film substrate, wherein the sub-film substrate comprises:

a sub base film having a first sub-surface and a second sub-surface opposite to each other;

a plurality of sub conductive wires arranged on at least one of the first sub-surface or the second sub-surface and comprising a plurality of sub input wires and a plurality of sub output wires; and a plurality of sub input pins and a plurality of sub output pins connected to the sub conductive wires and respectively arranged at a first edge and a second edge of the sub-film substrate, wherein the semiconductor chip comprises a plurality of chip terminals arranged on one surface of the semiconductor chip, wherein some of the chip terminals of the semiconductor chip are connected to the sub input wires, and other chip terminals of the semiconductor chip are connected to the sub output wires, wherein one of the connection conductive layers is provided between the sub input pins and the main input wires, and another one of the connection conductive layers is provided between the sub output pins and the main output wires, and wherein the main output pins are connected to the panel connection wires.

18. The display apparatus of claim 17, wherein the COF semiconductor package is connected to only one side from among four sides of the display panel.

19. The display apparatus of claim 17, wherein the first sub-module and the second sub-module are spaced apart from each other by a separation interval less than about 8 mm.

* * * * *